US012752358B2

(12) United States Patent
Ko et al.

(10) Patent No.: US 12,752,358 B2
(45) Date of Patent: Oct. 6, 2026

(54) SEALED SQUEEGEE FOR SUPPLYING SOLDER PASTE WITH UNIFORM DENSITY

(71) Applicant: ESE CO., LTD., Pyeongtaek-si (KR)

(72) Inventors: Hyung Rae Ko, Incheon (KR); Cheol Hong Myung, Incheon (KR)

(73) Assignee: ESE CO., LTD., Pyeongtaek-si (KR)

( * ) Notice: Subject to any disclaimer, the term of this patent is extended or adjusted under 35 U.S.C. 154(b) by 335 days.

(21) Appl. No.: 18/540,330

(22) Filed: Dec. 14, 2023

(65) Prior Publication Data

US 2024/0217013 A1 Jul. 4, 2024

(30) Foreign Application Priority Data

Dec. 28, 2022 (KR) ........................ 10-2022-0187219

(51) Int. Cl.
*B23K 3/06* (2006.01)
*H05K 3/3485* (2026.01)
*B23K 101/42* (2006.01)

(52) U.S. Cl.
CPC ......... *B23K 3/0638* (2013.01); *H05K 3/3485* (2020.08); *B23K 2101/42* (2018.08);
(Continued)

(58) Field of Classification Search
CPC ......... B23K 3/0638; H05K 2203/0126; H05K 3/1233; H05K 2203/0139; H05K 3/125; H05K 3/1216
See application file for complete search history.

(56) References Cited

U.S. PATENT DOCUMENTS

| | | | | |
|---|---|---|---|---|
| 4,519,760 A * | 5/1985 | Norell | .................. | H05K 3/4053 425/417 |
| 5,242,641 A * | 9/1993 | Horner | ................. | H05K 3/4053 425/290 |

(Continued)

FOREIGN PATENT DOCUMENTS

| | | | |
|---|---|---|---|
| KR | 10-1196284 B1 | 11/2012 | |
| KR | 20130117028 A * | 10/2013 | ......... H05K 31/1233 |

(Continued)

OTHER PUBLICATIONS

Communication dated Sep. 20, 2024, issued in Korean Application No. 10-2022-0187219.

*Primary Examiner* — Keith Walker
*Assistant Examiner* — Carlos J Gamino
(74) *Attorney, Agent, or Firm* — Sughrue Mion, PLLC

(57) ABSTRACT

A sealed squeegee for supplying a solder paste with a uniform density is disclosed. In the process of pressurizing and mixing the solder paste contained in a pressurization chamber by a pumping pad that contracts and expands according to injection and discharge of compressed air, the sealed squeegee minimizes a pressure change within the pressurization chamber due to a pressure shock within the pressurization chamber, reduces the number of components by coupling separate components of the existing buffer device and pressurization device into a single pumping pad, prevents a pressure drop within the pressurization chamber by improving sealing capability, prevents unnecessary waste of the solder paste through ease of disassembly and assembly by reducing the number of components and precision in discharging the appropriate amount of solder paste, and improves printing quality by improving cleanability for using different types of solder pastes.

7 Claims, 15 Drawing Sheets

(52) U.S. Cl.
CPC ................ *H05K 2203/0126* (2013.01); *H05K 2203/0139* (2013.01)

(56) References Cited

U.S. PATENT DOCUMENTS

| | | | | |
|---|---|---|---|---|
| 6,746,710 | B1 * | 6/2004 | Lambert | B23K 3/0607 427/288 |
| 2002/0038814 | A1 * | 4/2002 | Mimura | B23K 3/0607 228/256 |
| 2004/0187716 | A1 * | 9/2004 | Pham-Van-Diep | H05K 3/1233 101/123 |
| 2012/0325533 | A1 | 12/2012 | Yoshimura | |
| 2013/0199386 | A1 * | 8/2013 | Lynch | B41F 15/42 101/129 |

FOREIGN PATENT DOCUMENTS

| | | | | | |
|---|---|---|---|---|---|
| KR | 10-2013-0133125 | A | | 12/2013 | |
| KR | 10-1356562 | B1 | | 1/2014 | |
| KR | 20140132666 | A | * | 11/2014 | H05K 3/3485 |
| KR | 101523010 | B1 | * | 5/2015 | B41F 17/00 |
| KR | 101658406 | B1 | * | 9/2016 | H05K 3/1233 |
| KR | 10-2100515 | B1 | | 4/2020 | |
| KR | 10-2021-0055222 | A | | 5/2021 | |

* cited by examiner

【Fig. 1】
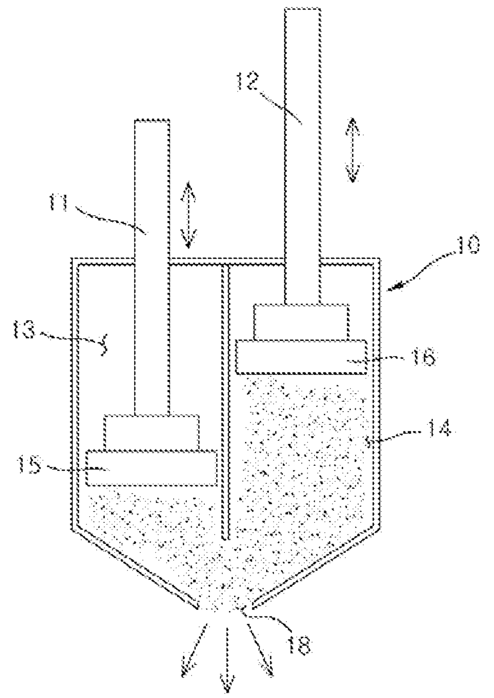
【Fig. 2】
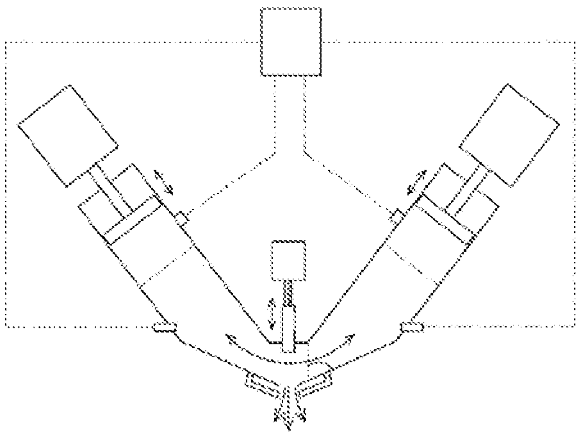

【Fig. 3】
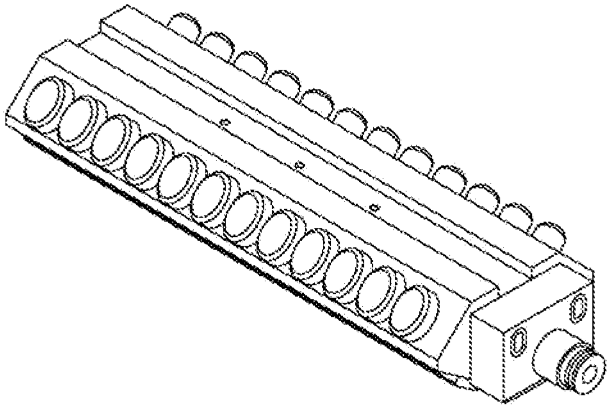
【Fig. 4】
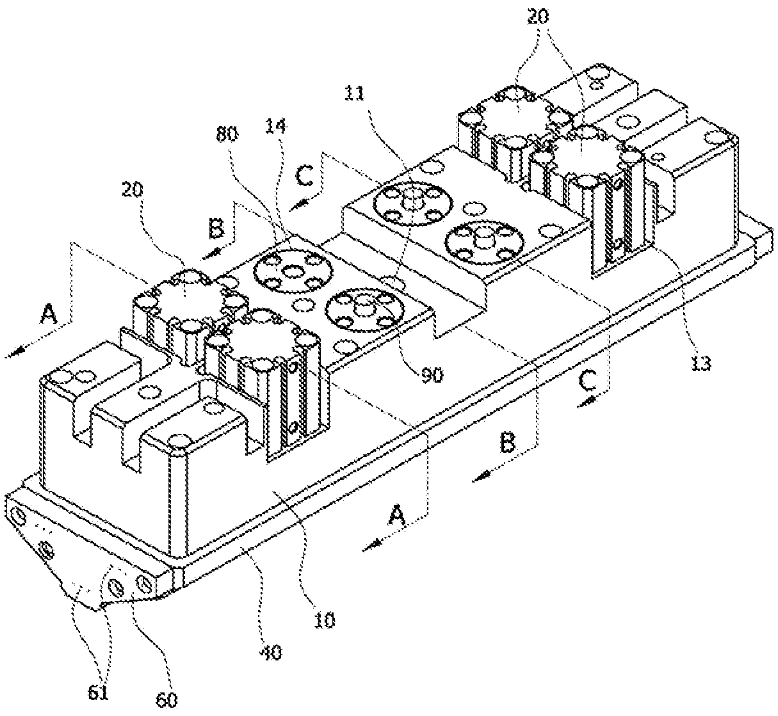

【Fig. 5】
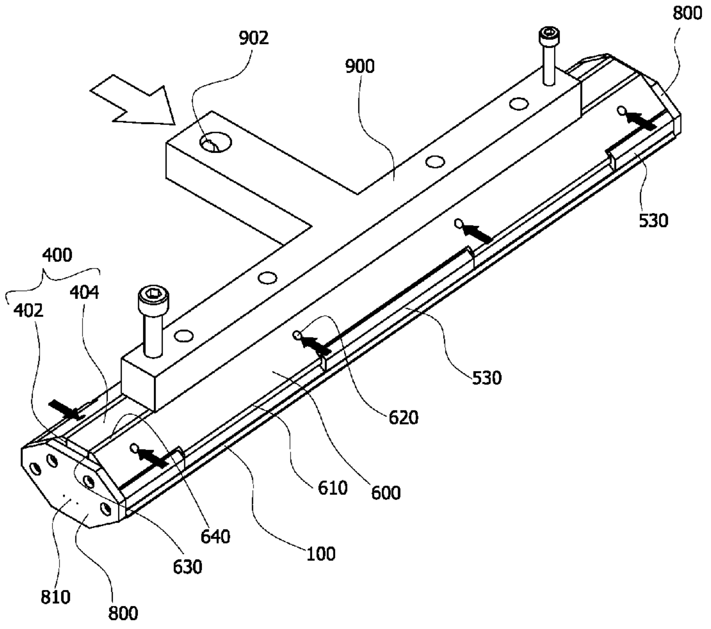

【Fig. 6】
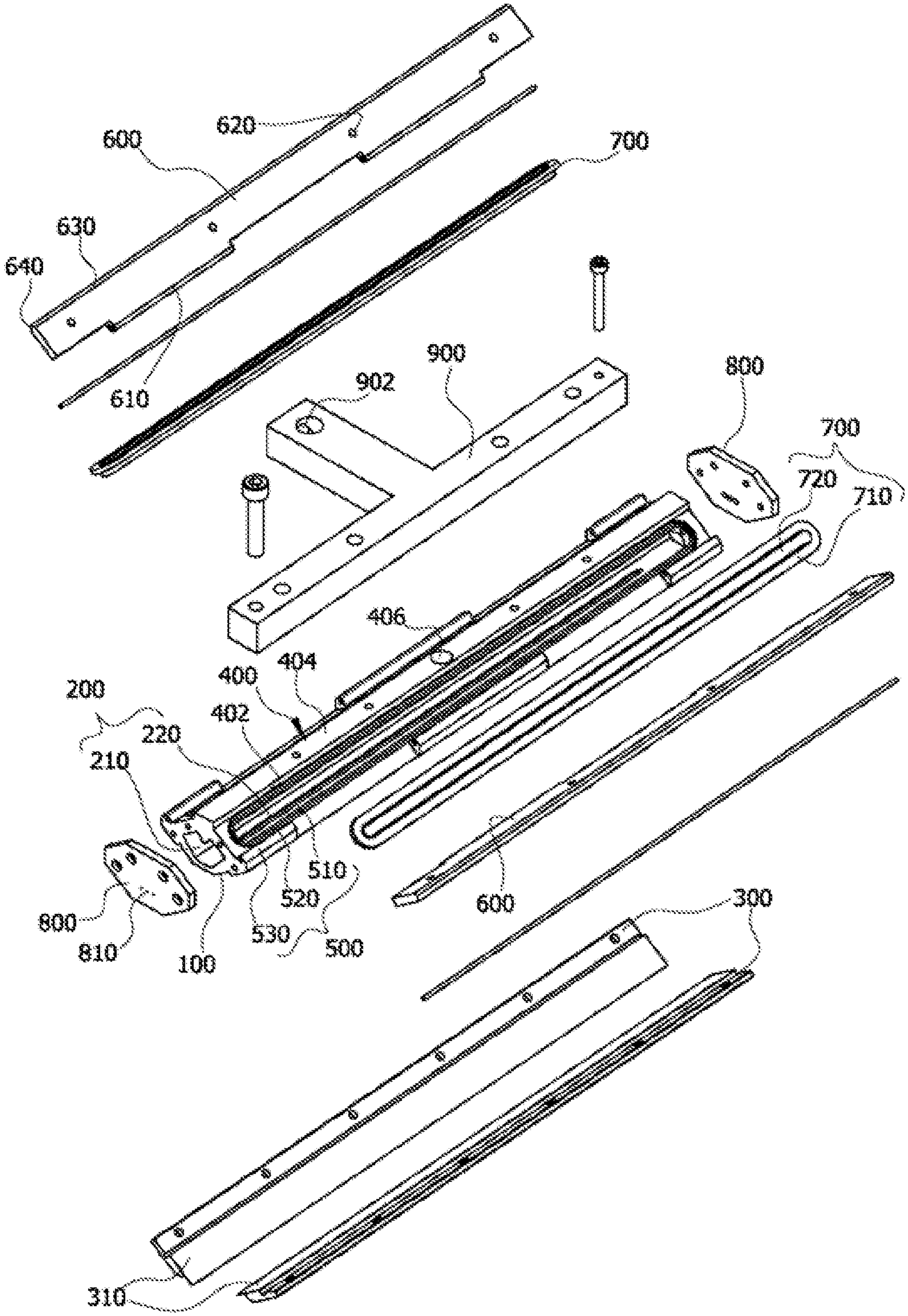

【Fig. 7】
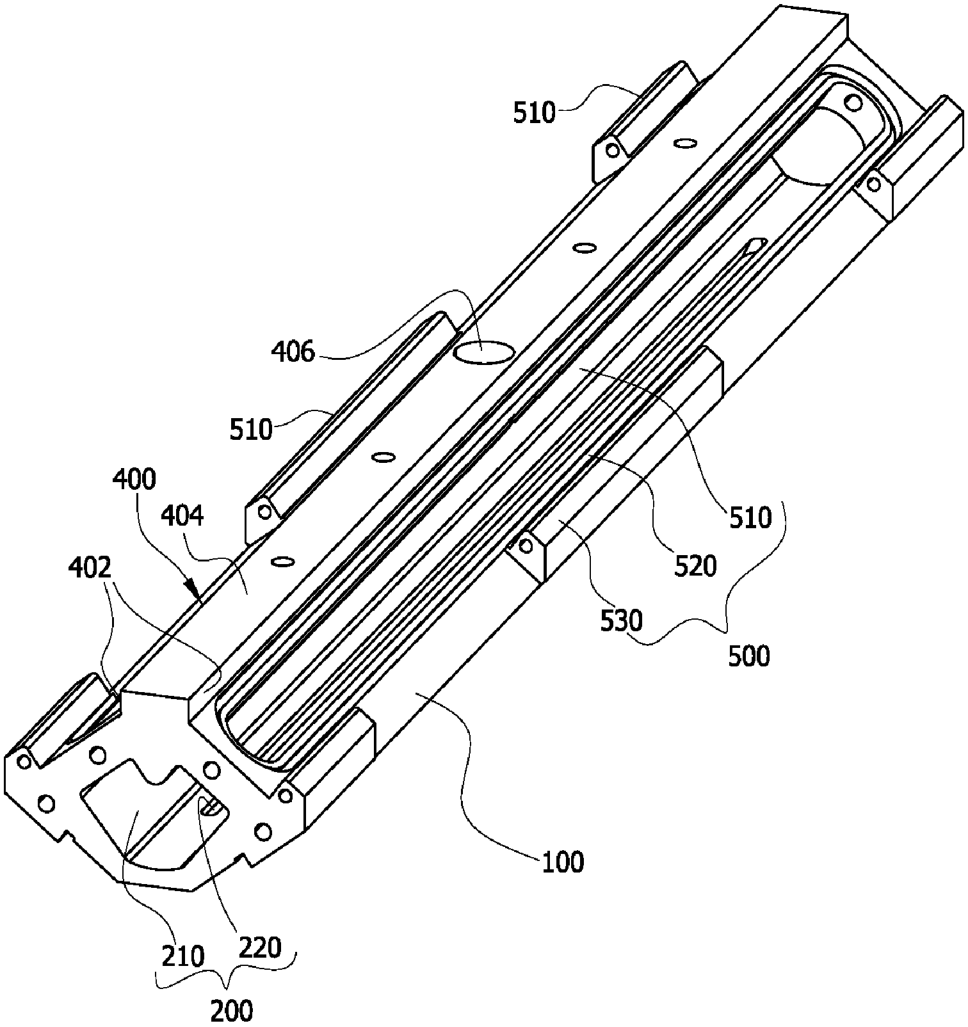

【Fig. 8】
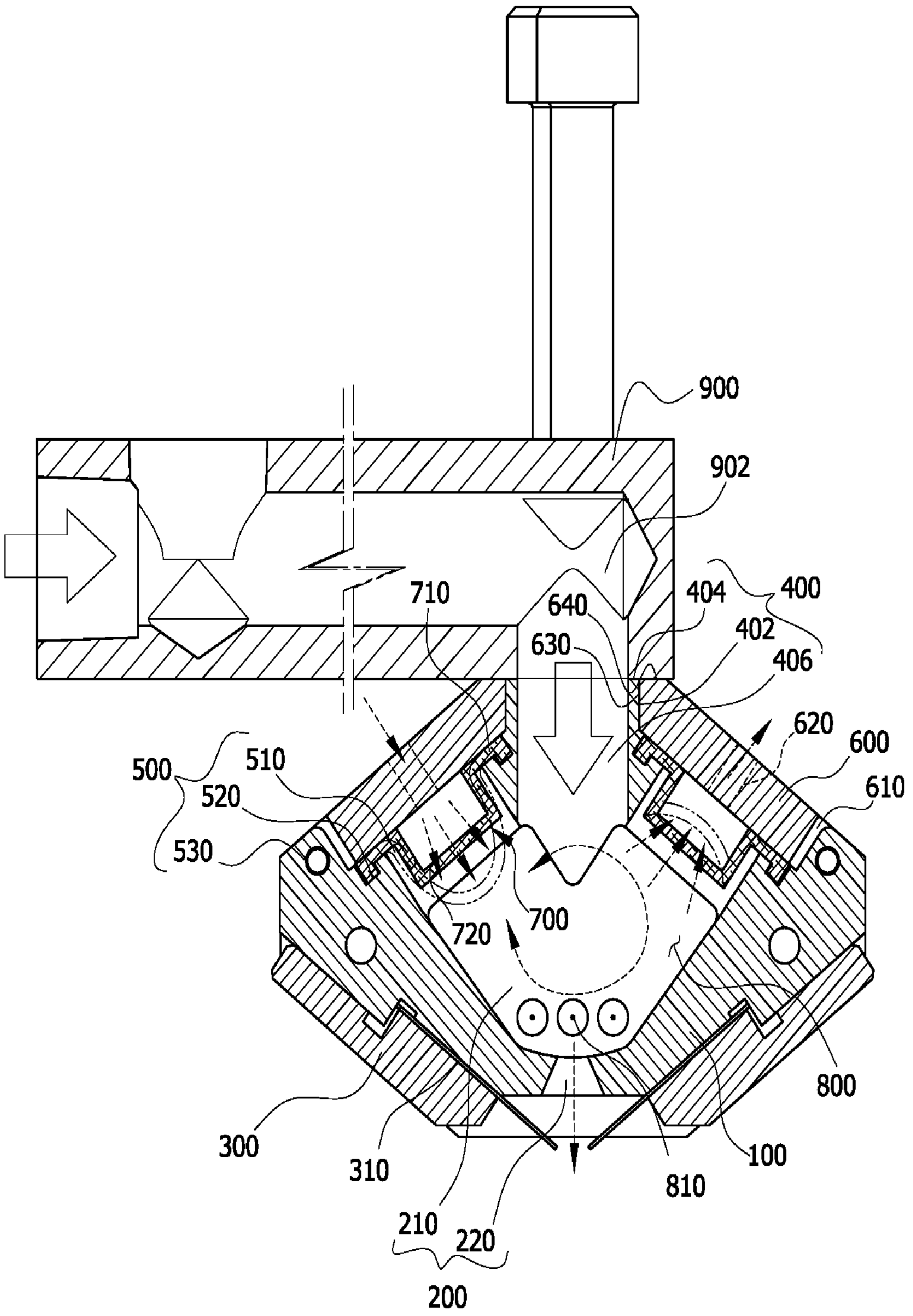

【Fig. 9】
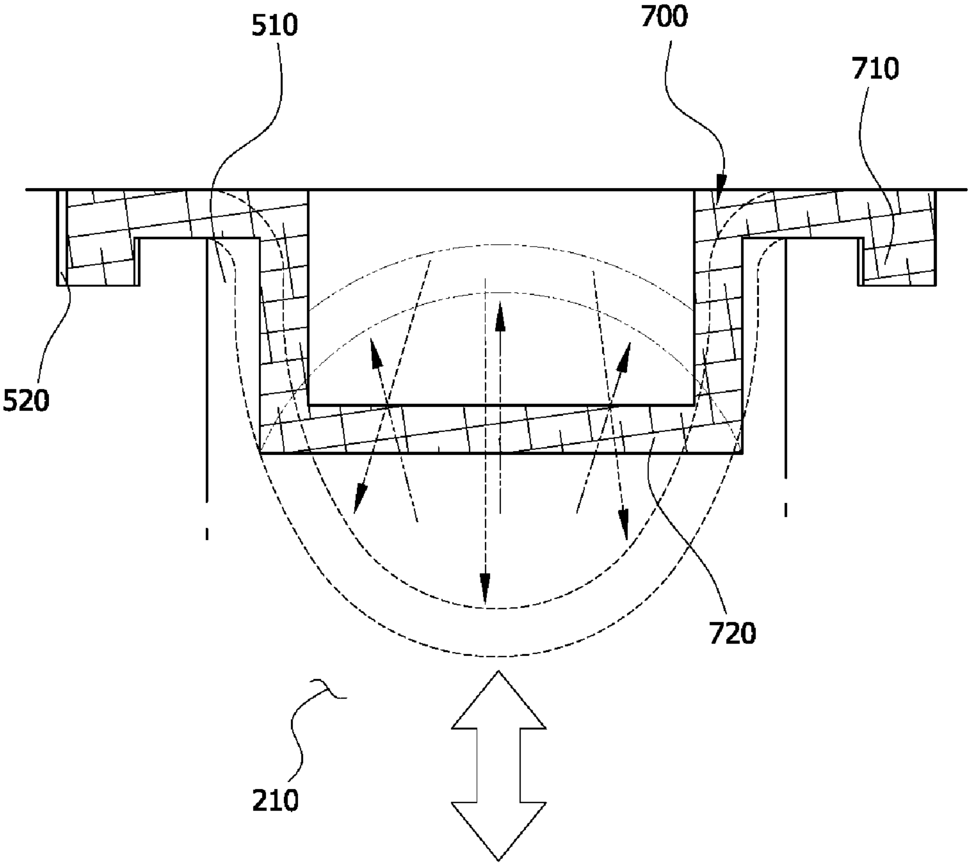

【Fig. 10】
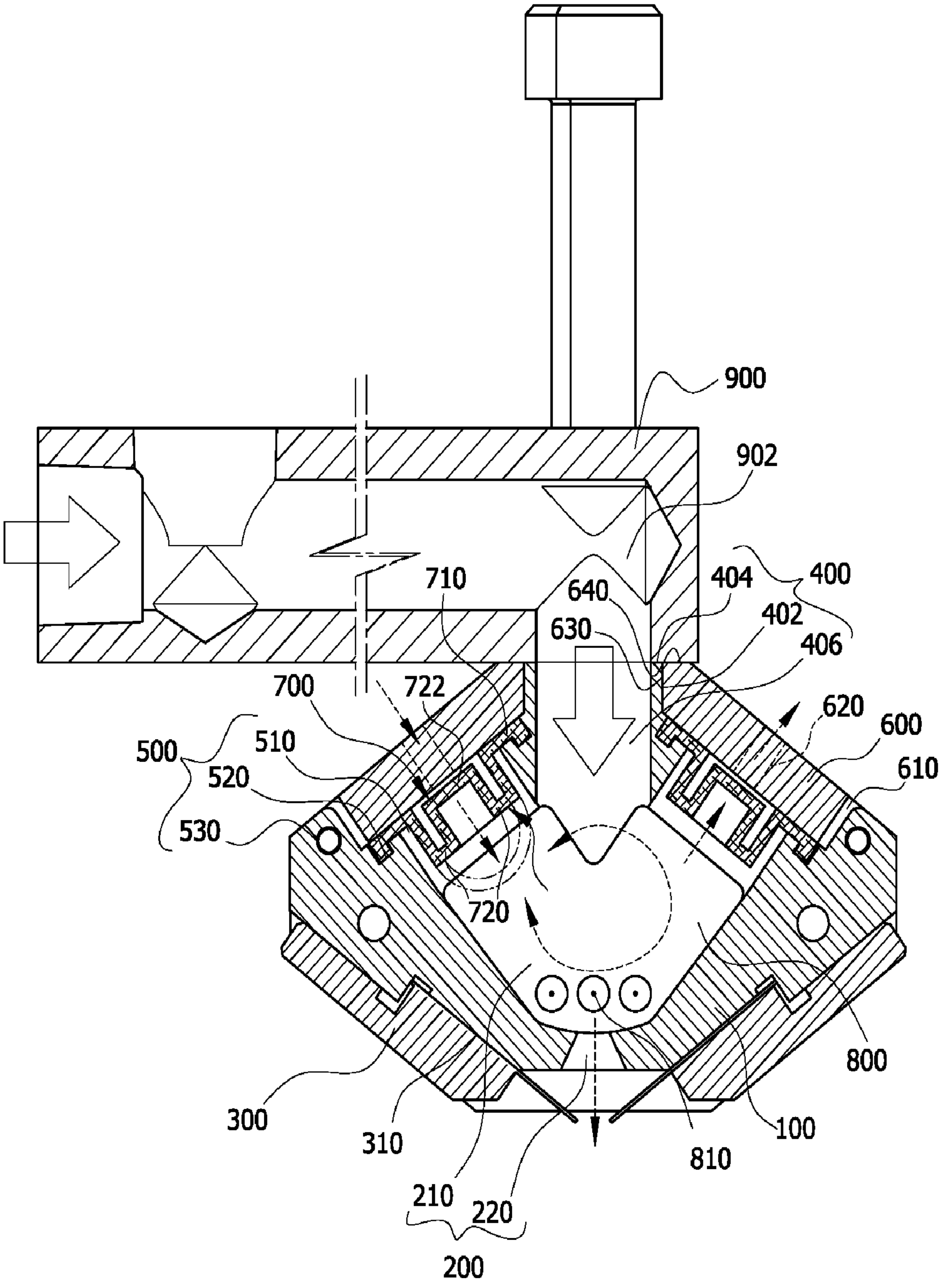

【Fig. 11】
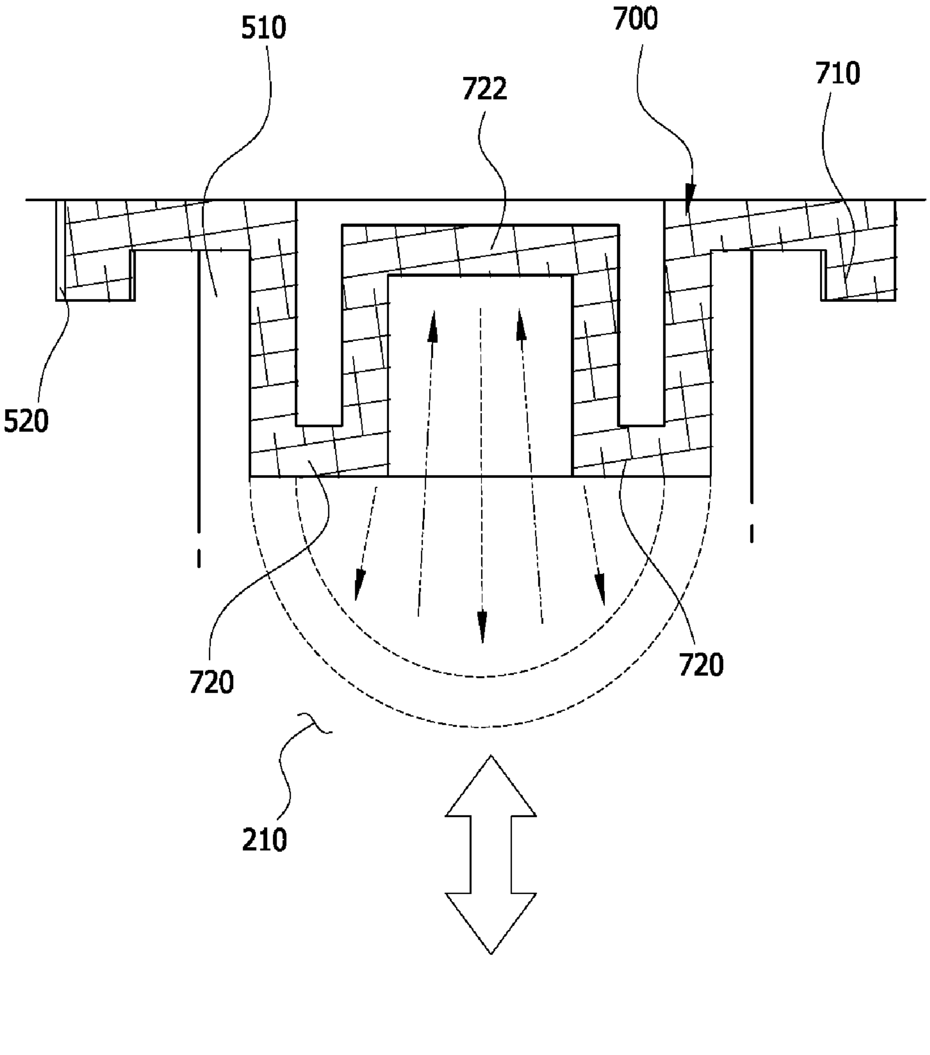

【Fig. 12】
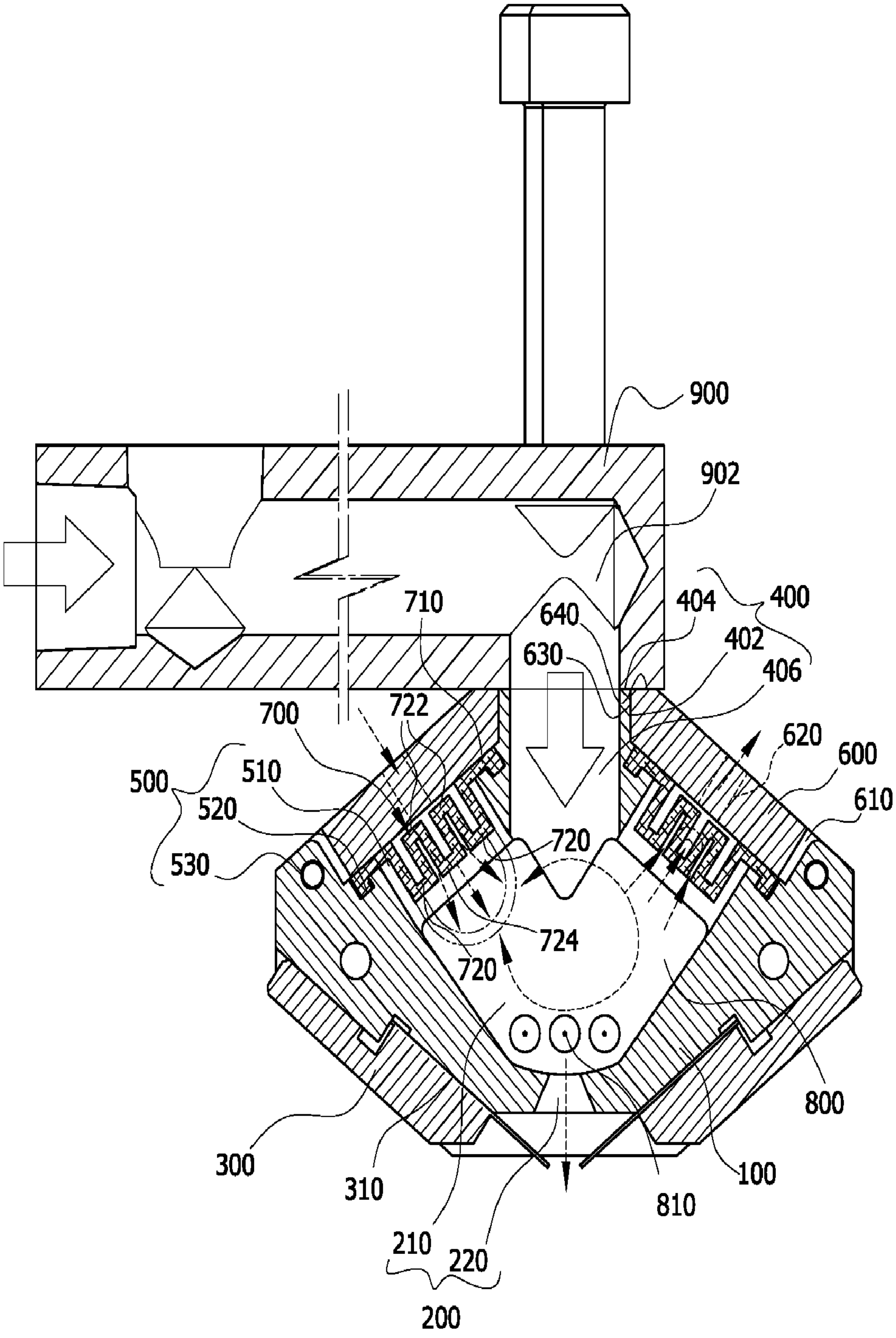

【Fig. 13】
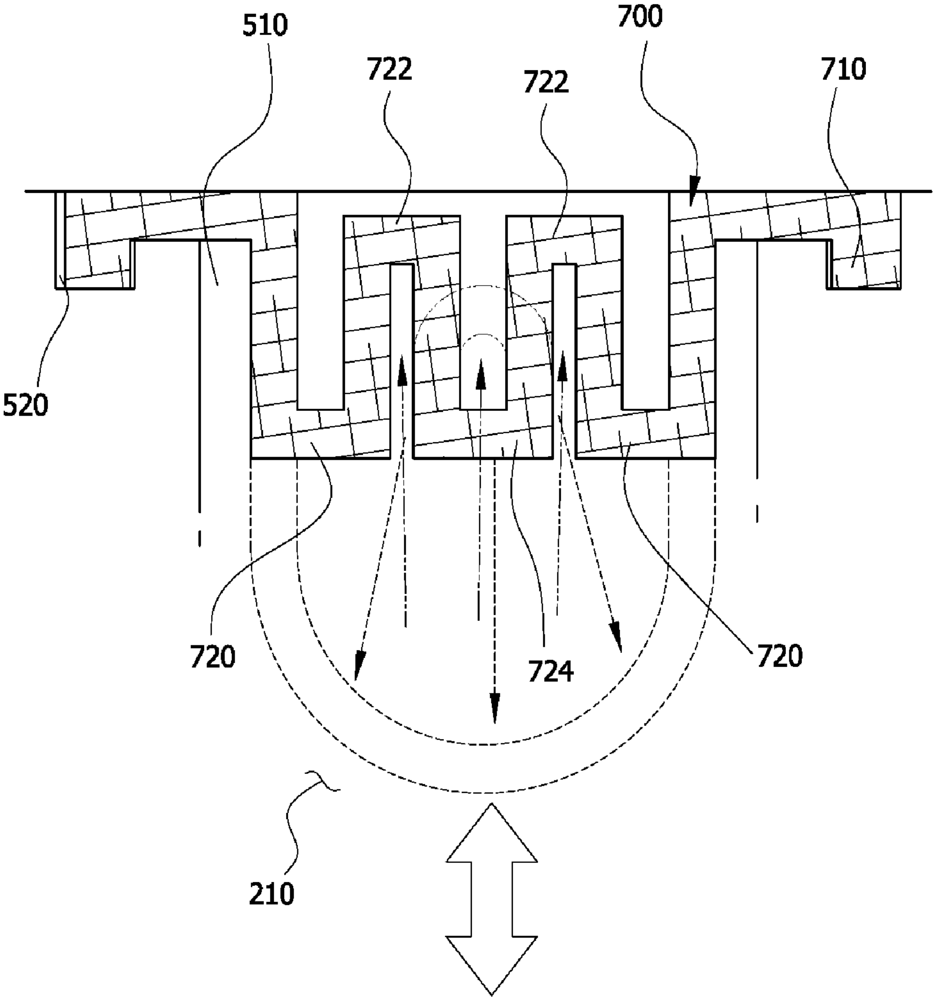

【Fig. 14】
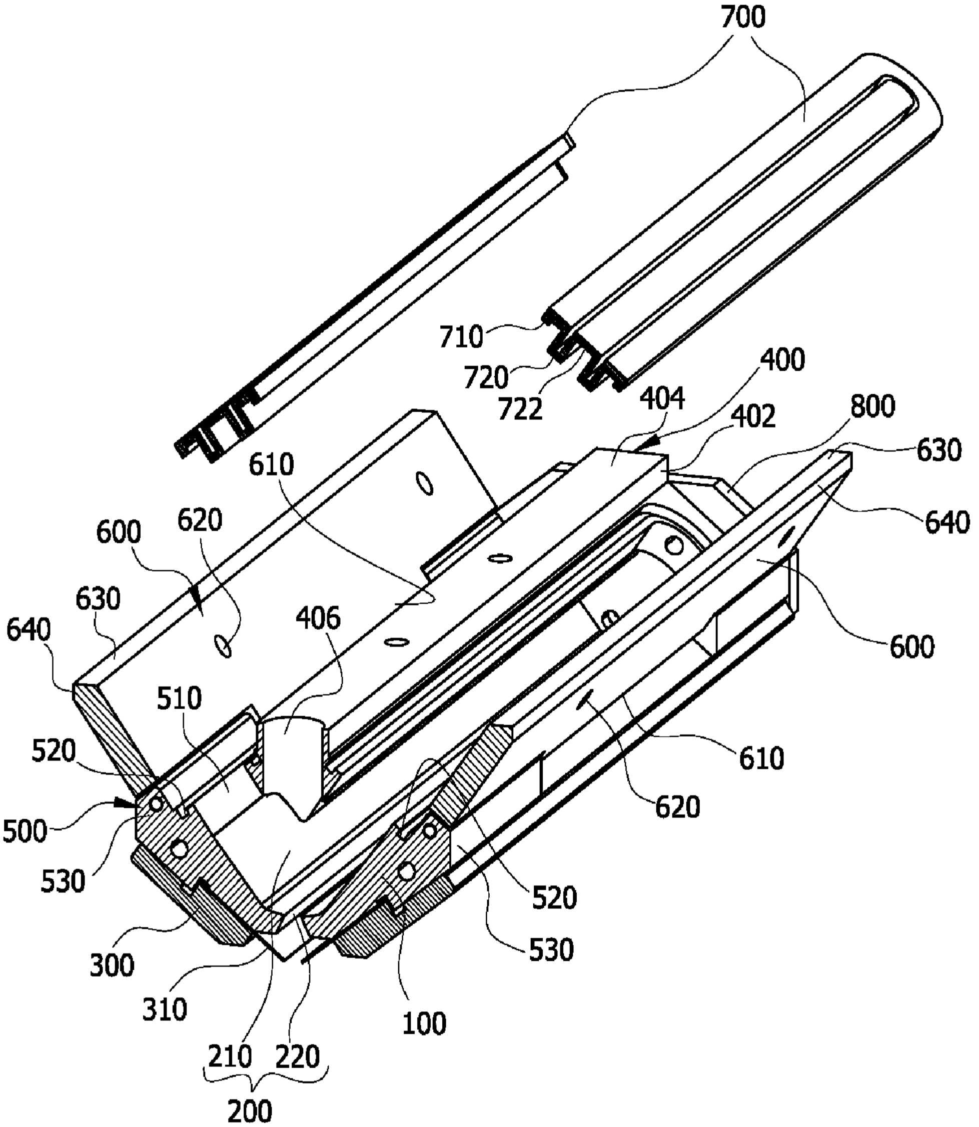

【Fig. 15】
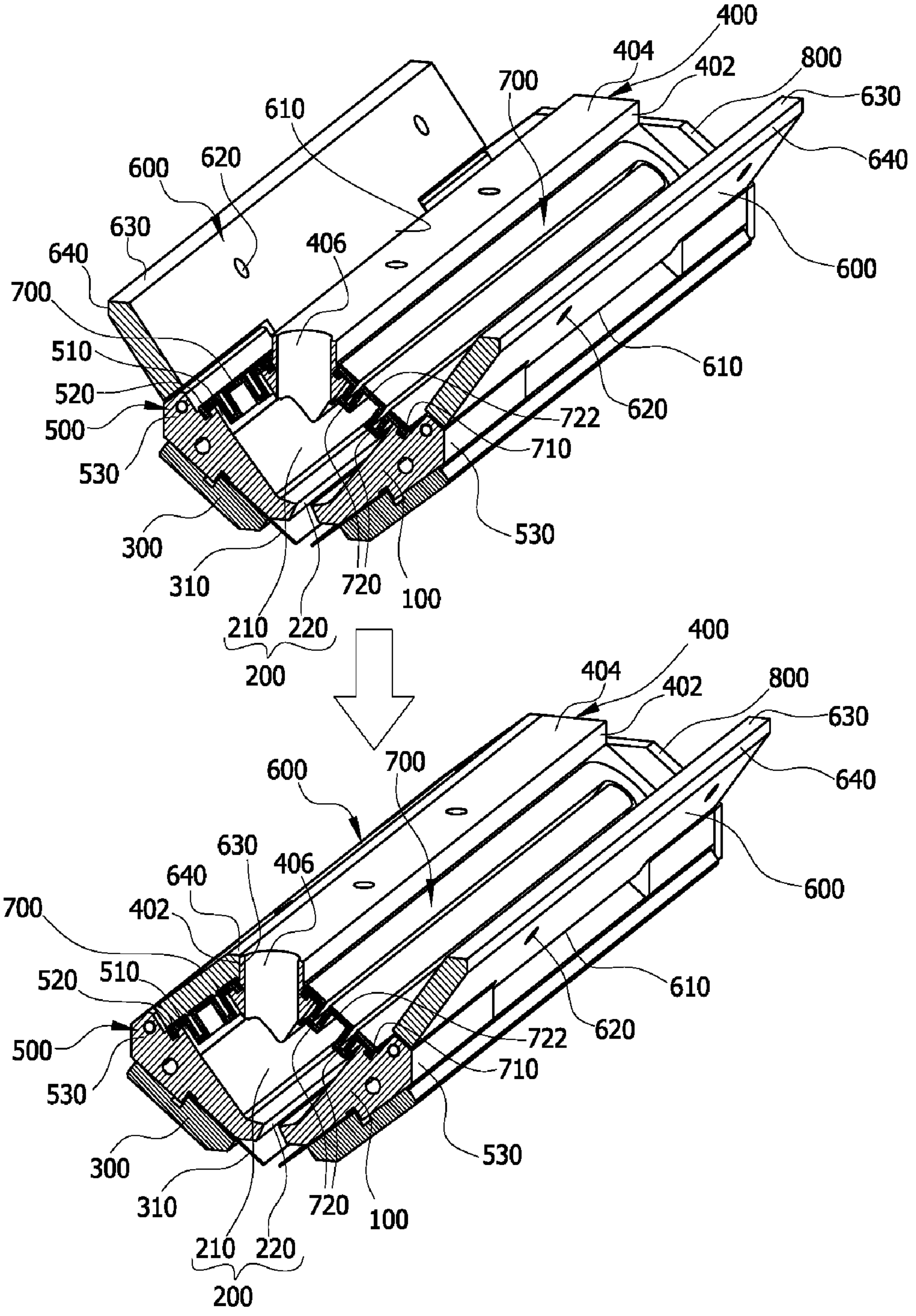

【Fig. 16】
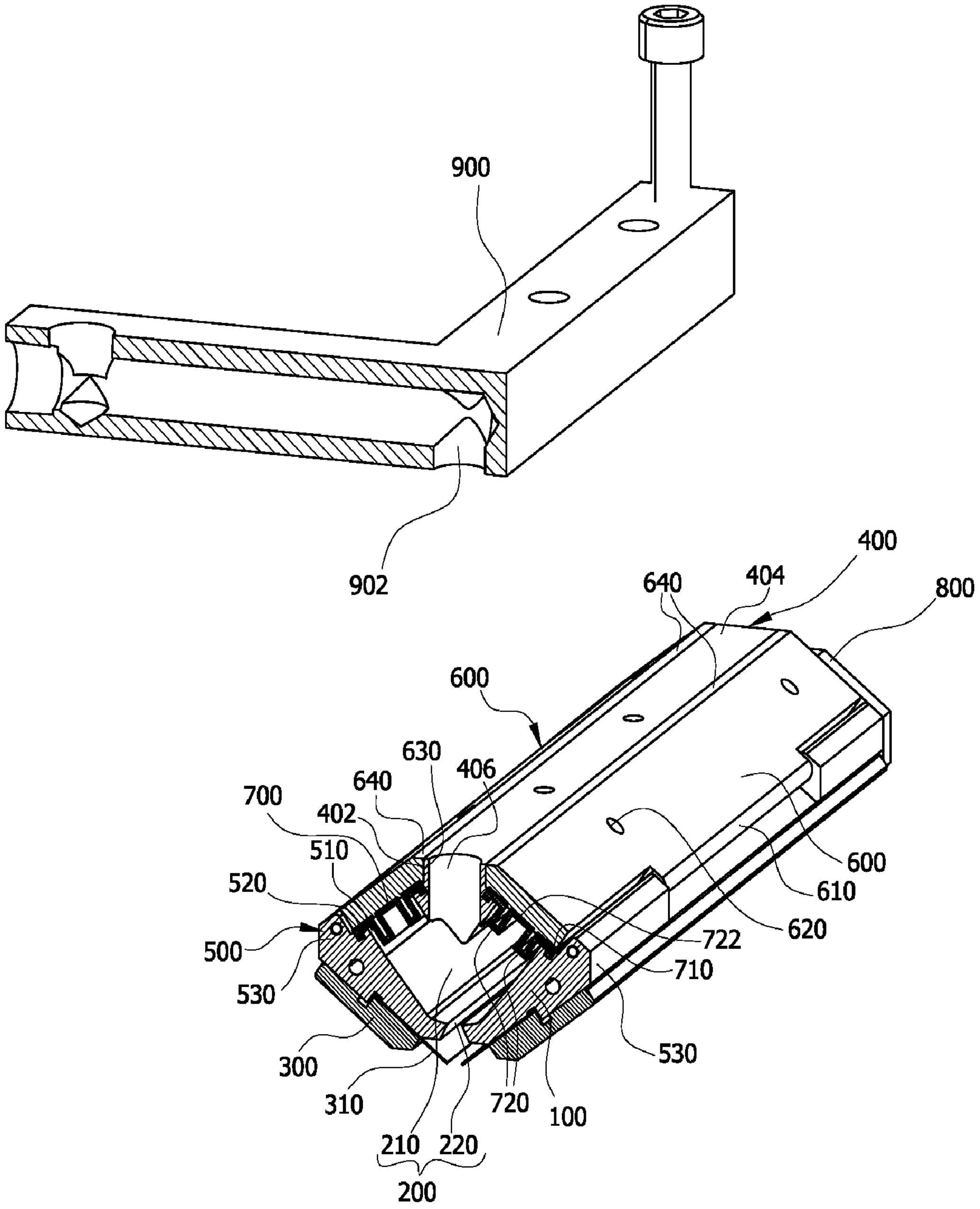

【Fig. 17】
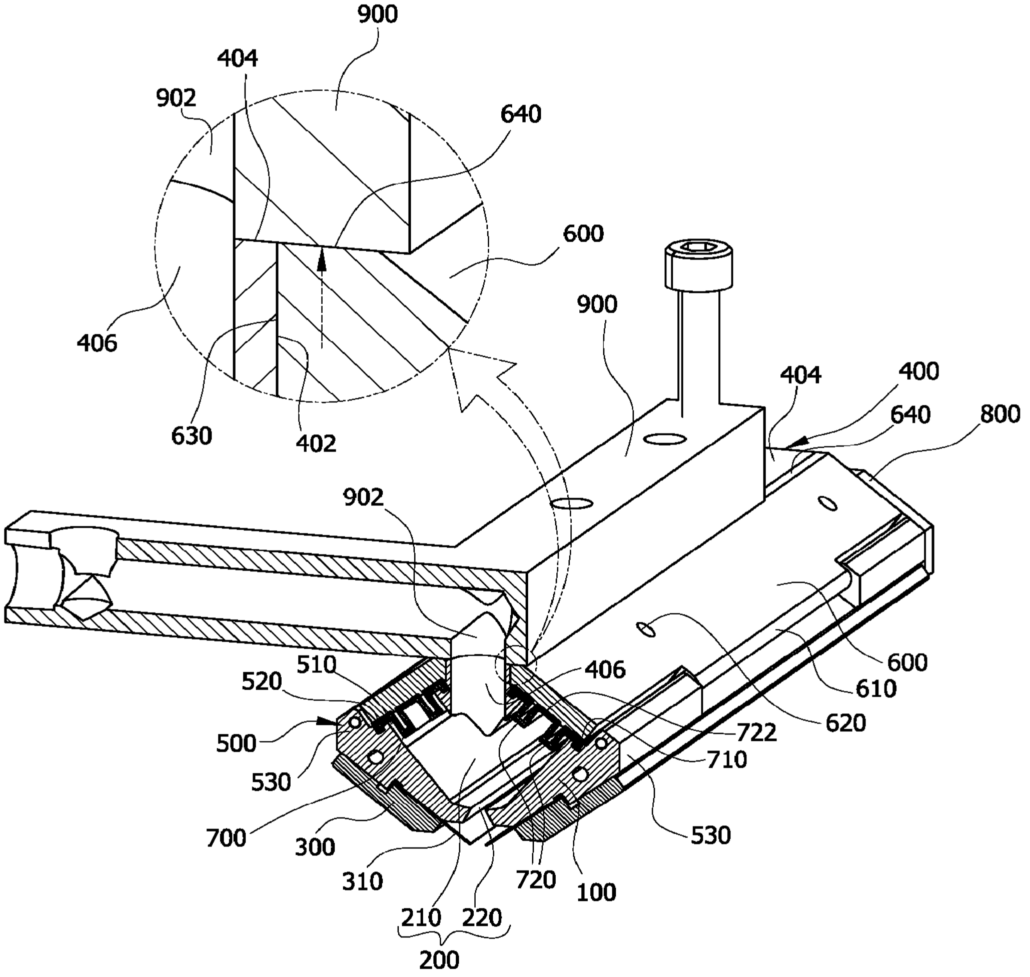

SEALED SQUEEGEE FOR SUPPLYING SOLDER PASTE WITH UNIFORM DENSITY

CROSS-REFERENCE TO RELATED APPLICATION

This application claims priority to and the benefit of Korean Patent Application No. 2022-0187219, filed on Dec. 28, 2022, the disclosure of which is incorporated herein by reference in its entirety.

BACKGROUND OF THE INVENTION

1. Field of the Invention

The present disclosure relates to a sealed squeegee for supplying a solder paste with a uniform density, and more particularly, to a sealed squeegee for supplying a solder paste with a uniform density, which improves screen printing quality of a printed circuit board (PCB) as a supplied solder paste is mixed, adjusted, and applied with a uniform density during screen printing, minimizes waste of a raw material by minimizing product defects therefrom and minimizing the amount of remaining solder paste after the solder paste is supplied, minimizes a rate of printing defects through printing without mixing between different types of solder cream by reducing a cleaning time through simplification of components, ensures constancy of solder supply by cross pumping in which expansion and contraction are performed by improved sealing capability and compressed air, and simultaneously pressurizes and discharges a large amount of solder rather than locally pressuring on the same line.

2. Description of the Related Art

In general, a melting state solder paste is printed in a certain pattern on a printed circuit board (PCB) built as a major component of electronic devices such as computers and home appliances to mount various types of electronic components such as semiconductor chips and resistance chips. Such a printing process of a solder paste is performed by a screen printer device, and the screen printer compresses a solder paste supplied to a metal mask formed with an opening of a particular pattern by using a squeegee and applies the solder paste to a component mounting portion of a PCB.

FIG. 1 is a schematic diagram showing the inside of an example of a solder pump. Referring to FIG. 1, a solder pump 10 is mounted on a screen printer and injects the solder paste on a mask, and includes a first chamber 13, a second chamber 14, a first pressing plate 15, a first pressing rod 11, a second pressing plate 16, a second pressing rod 12, and a nozzle unit 18.

The inside of the solder pump 10 is separated into the first chamber 13 and the second chamber 14, and a solder paste is accommodated in each of the first chamber and the second chamber. The first pressing plate 15 reciprocates inside the first chamber and is in contact with the solder paste accommodated in the first chamber. The first pressing rod is coupled to the first pressing plate 15, and in general, a driver is connected to the first pressing rod to apply a pressure to the solder paste accommodated in the first chamber. Similarly, the second pressing plate 16 reciprocates inside the second chamber and is in contact with the solder paste accommodated in the second chamber. The second pressing rod is coupled to the second pressing plate 16, and in general, a driver is connected to the second pressing rod to apply a pressure to the solder paste accommodated in the second chamber. As the first pressing rod 11 and the second pressing rod 12 are repeatedly rise and fall, the solder paste accommodated inside the first and second chambers is sprayed on the mask through the nozzle unit 18.

The solder pump 10 as shown in FIG. 1 may be designed to supply the same quality solder paste and minimize the amount of an abandoned solder paste by spraying a solder paste accommodated in two different chambers while alternately pressurizing the same, but not in operation. The reason is that when the first chamber 13 is pressed by the first pressing plate 15, the solder paste is discharged through the nozzle unit 18, but a pressure change of the solder paste irregularly occurs while the solder paste at a side of the second pressing plate 16 flows due to the pressure change in the solder paste at a side of the nozzle unit, and a discharge density of the solder paste, which is actually discharged through the nozzle unit 18, is also irregular.

Therefore, there are the following problems, and for example, in a solder paste printing process, a solder paste of uneven quality causes poor installation of electronic components on a printed circuit board, after the process is completed, cleaning defects also occur due to the remaining amount of solder paste remaining inside a solder pump, and it is impossible to completely clean the remaining amount of solder paste, and thus when different types of solder pastes are inserted, poor purity of the solder paste is caused and printing defects are resulted, and a waste of money due to the remaining expensive solder paste is caused.

A conventional solder paste supply device shown in FIG. 2 is disclosed. The first chamber and the second chamber are formed symmetrically, and a bottleneck connector connecting the first chamber and the second chamber is formed in a shape of "V". A first pressurizer and a second pressurizer are formed at one side of the first chamber and the second chamber, respectively and are left and right symmetrical. A nozzle unit is formed in the bottleneck connector. In the conventional solder paste supply device, the first pressurizer and the second pressurizer provided on left and right sides are operated to press a solder paste accommodated in each chamber and allow the solder paste to move to the bottleneck connector and to be discharged to the nozzle unit of the bottleneck connector. The feature here is to ensure that a pressure at a side of the nozzle unit increases compared to a pressure of each chamber through the bottleneck connector, and thus the solder paste compensates for a pressure drop when the solder paste is discharged through the nozzle unit to allow a solder paste to be uniformly discharged.

However, this is also the configuration of a bottleneck connector having a simply narrowed section, and when an initial solder paste is sufficient, it is possible to discharge a uniform density of the solder paste, but when the solder paste is insufficient, pressure compensation of the bottleneck connector is not easy, and thus there is a problem that the solder paste is discharged with an uneven density, which leads to a printing failure and a product failure. Although a partial cross-section blocking plate is formed to compensate for a pressure drop of the bottleneck connector of the conventional solder paste supply device, it is also difficult to compensate for the pressure when the remaining amount of the solder paste is low, there is a problem in that sections from which the solder paste is discharged through the nozzle unit interfere with each other and the solder paste is unevenly discharged.

It has been recently disclosed to overcome this problem, as shown in FIG. 3, Korean Patent No. 10-1658406 registered on Sep. 12, 2016 discloses a solder paste uniform density supply device that supplies a solder paste to correspond to a pattern formed on a mask to mount various electronic components on a printed circuit board (PCB) and adjusts the solder paste to have a uniform density to always supply the solder paste with the same density by buffering a pressure shock to be generated during pressurization within a chamber by a pressurization device to minimize a pressure change in a chamber and continuously compensating for a pressure drop of a nozzle unit to always maintain constant a pressure within the chamber by a pressurization device and stably discharge the solder paste with a uniform density, thereby improving printing quality, minimizing product defects, minimizing the amount of solder paste remaining after supplying the solder paste, and reducing waste of a raw material.

The solder paste uniform density supply device is configured in such a way that a solder is filled in a buffer accommodator formed a long way in a longitudinal direction, and the filled solder is discharged by a pressure through a nozzle unit at a lower side having the same length as a length of the buffer accommodator in the longitudinal direction, the solder paste supplied through a solder past supply is pressurized and released to fill the solder in the buffer accommodator by the pressurization device while the pressurization device reciprocates through the pressurization chamber, and correspondingly a buffer adjuster buffers the pressure depending on the pressurized and released pressure by the pressurization device while reciprocating in a pressure buffer adjusting chamber, and thus the solder paste is discharged through the nozzle unit with an even density under an even pressure.

However, a plurality of pressurization chambers and a plurality of pressure buffer adjusting chambers of the solder paste uniform density supply device are formed at equivalent intervals, the pressurization device and the buffer adjuster are locally coupled to the pressurization chamber and the pressure buffer adjusting chamber, respectively, to locally pressurize and release the solder paste filled in the buffer accommodator formed a long way in a longitudinal direction, and accordingly, it is difficult to mix the solder paste with an even density, and during a pressurization and releasing process by the pressurization device and the buffer adjuster in a state in which the solder paste is filled, there is a problem in that the solder paste is not uniformly distributed in the entire buffer accommodator as a vacuum is formed in each chamber, and thus there is a problem in that a solder paste injected to a mask is not uniformly supplied. This causes printed defects because the solder paste is not properly supplied to the mask. That is, as the plurality of pressurization chambers and the pressure buffer adjusting chamber are configured, there is a problem in that a pressure is not applied between the chambers, and also, it is difficult to mix a solder paste itself because each chamber is locally applied onto the solder paste, it is not easy to discharge inner air due to a vacuum generated in each chamber while the solder paste is filled in the buffer accommodator, and there is a problem in that the density of the solder paste is not uniform.

As the plurality of pressurization chambers and the pressure buffer adjusting chamber are configured, disassembly and assembly are difficult, and when different types of solder pastes are used, it is not easy to remove the solder paste during a cleaning process to replace the solder paste, and thus there is a problem in that cleanability is degraded. As described above, when cleanability is reduced and a solder paste remains in each chamber, there is a problem in that different types of solder paste are diluted with each other, resulting in product defects.

As described above, as many devices act locally, a pressure change occurs in each location of the pressurization device, it is impossible to apply a pressure equally, it is difficult to stir the solder paste, and it is difficult to supply the solder paste with a uniform density. This pressure change is a problem in that air contained in the chamber is not capable of escaping to the outside due to a vacuum being applied, which acts as a factor that interferes with smooth stirring of the solder paste.

In terms of cleanability, which is briefly mentioned above, as a plurality of pressurization devices and buffer adjusters are formed, and a correspondingly a plurality of pressurization chambers and pressure buffer adjusting chambers are formed, disassembly and assembly are difficult, and cleaning after supply and use of a solder paste is not easy. There is a problem that all components connected to each chamber need to be uncoupled for cleaning, and because a plurality of component are formed, there is a risk of loss during a cleaning process, and thus great care needs to be taken during cleaning.

Because ease of cleanability is degraded, as mentioned above, in a process of using different types of solder cream for each type, dilution and mixing between solder creams occur, and thus it difficult to ensure uniformity or constancy of product quality, and there is a problem that causes a large number of defects.

Even if multiple chambers are disassembled and assembled, it is difficult to couple the chambers to maintain a sealing force like a first time, and thus during reassembly, a production process of a product needs to be actually checked to ensure that each component is precisely assembled while maintaining the sealing force, and when a coupling state indicates that the sealing force is poor, it is difficult to know how the sealing force is maintained, and thus there is a problem that an inconvenience of having to disassemble and reassemble the entire assembly.

When different pressures are applied to respective chambers, it is not easy to stir solder cream, and although it is possible to obtain a substantially uniform density of solder paste, there are sections in which a uniform density of solder paste is not obtained due to a pressure loss in certain areas. In other words, the currently disclosed solder paste uniform density device maintains a pressure in the chamber uniformly, buffers a pressure shock, and minimizes a pressure change to obtain a uniform density of solder paste, but due to the many problems as described above, there is a need for a solder face uniform density device that overcomes the above-mentioned problems.

In other words, cleaning is necessary to prevent mixing or dilution of different types of solder cream, which is the core of the above problems. However, in the currently disclosed solder paste uniform density device, cleanability is significantly degraded, and different types of solder cream are frequently mixed and diluted, resulting in product defects, and thus there is a need for a solder paste uniform density device with improved cleanability. In response to these needs, a solder pastes uniform density supply device that has been recently introduced is a solder paste uniform density supply device with improved cleanability, disclosed in Korean Patent No. 10-2100515 registered in Apr. 8, 2020. As shown in FIG. 4, the uniform density supply device includes a cylinder housing 10 in which an injection port 11, a cylinder placing unit 13, and a guide placing unit 14 are formed, a pressurized buffer cylinder 20, a piston head, a solder basket 40, a divider member, a side cover 60, a squeegee blade holder, a guide housing 80, and a guide shaft 90.

In this regard, an internal space of the solder basket, which has a space with an inverted triangular cross-section inside, is formed a long way in a longitudinal direction and is divided into individual compartments by a divider member, and the cylinder housing is airtightly coupled to an upper part of the solder basket. Before airtight coupling, a pressurized buffer cylinder is attached to the upper part of the cylinder housing, and the piston head is attached to a fore end of a rod of the cylinder with a length corresponding to left and right spaces of the solder basket divided by the divider member. The aforementioned coupled uniform density supply device is similar to the aforementioned solder paste uniform density supply device in terms of an operating state in which a solder paste is mixed with a uniform density, but in terms of improvement in cleanability, which is the most important, the piston head for pressurization and buffering has a shape that corresponds to a longitudinal direction of left and right insides of the solder basket in which the solder paste is supplied and discharged, making disassembly and assembly easy. The inverted triangle-shaped internal space of the solder basket is divided into left and right compartments by the divider member, and as a result, the internal space of the solder basket is completely opened by disassembling the divider member, which may be disassembled and assembled, making cleaning easy.

Therefore, the problem of cleanability, which has been a problem before, is resolved through simplification of components, but the airtightness of the divider member is not maintained in the process of supplying the solder paste to a space partitioned by the divider member and mixing the solder paste by pressurization and buffering, a problem arises when the space divided into left and right sides and the spaces do not communicate, and as a result, defects occur when mixing the solder paste with a uniform density, resulting in printing defects. The piston rod performs pressurization and buffering under an operation of the pressurized buffer cylinder. As the piston rod itself is formed a long way, the pressure is distributed irregularly, resulting in localized pressure in that a pressure is applied only to specific areas. A new problem arises that makes it difficult to mix the solder paste with a uniform density due to the buffering problems.

When a pressing force and buffering capacity of the pressurized buffer cylinder are not the same, this becomes more severely. In this regard, the piston rod is formed a long way in front and rear directions, and accordingly, due to a difference in pressing force before and after, like a seesaw, when 10 of a front pressing force is applied, a rear pressing force is 8 to 9, and as a result, the piston rod is not capable of being pressed while maintaining the same horizontal state, but rather is pressed in an inclined manner like a seesaw, and accordingly, there is a problem in that mixing of the solder paste with a uniform density is not smoothly achieved. In other words, the problems caused by mixing different types of solder pastes have been improved by improving cleanability, but when the local pressure changes due to pressure differences during the operation process and the front and back are not pressed with the same pressure, the piston rod itself causes vertical movement defects, causing solder printing defects occur due to breakage or damage to the paste uniform density supply device or problems with pressure leaking from communication during the up and down operation of the piston rod.

CITED REFERENCE

Patent Document

1) Korean Patent No. 10-1356562, registered on Jan. 22, 2014
2) Korean Patent No. 10-1196284, registered on Oct. 25, 2012
3) Korean Patent No. 10-1658406, registered on Sep. 12, 2016
4) Korean Patent No. 10-2100515, registered on Apr. 8, 2020

SUMMARY OF THE INVENTION

Therefore, the present disclosure has been made in view of the above problems, and it is an object of the present disclosure to provide a sealed squeegee for discharging a solder paste with a uniform density, in which, among the components of the conventional solder paste uniform density supply device according to the present disclosure, a pressure buffer adjusting chamber and a pressurization device and a buffer adjuster that are correspondingly coupled thereto are integrated with the pumping pad to form a single component, thereby reducing the number of components, improving a sealing force, and simplifying even pressurization and buffering of the pressure, the solder paste for printing is discharged with a uniform density by quickly discharging internal air to the outside from left and right sides of the pressurization chamber and mixing the solder paste with a uniform density within the pressurization chamber and filled without voids.

It is another object of the present disclosure to provide a sealed squeegee for discharging a solder paste with a uniform density, in which, in the pressurization chamber as a component of the conventional solder paste uniform density supply device, the solder paste is mixed at a uniform pressure, while the pressure buffer adjusting chamber, the pressurization device, and the buffer adjuster are integrated into the pumping pad configuration, thereby simplifying and disassembling components, improving ease of assembly and cleanability, and allowing cleaning without residue of solder paste once used, and through this, when using a different type of solder paste, a defect rate is minimized because there is no heterogeneous mixing between the remaining solder paste and the newly introduced solder paste, and the sealing force is improved and a large amount of solder along the longitudinal direction of the pressurization chamber is simultaneously discharged through a single pumping process, thereby effectively and quickly forming uniform density of solder paste through pressurization and achieving a short stirring time.

It is a further object of the present disclosure to provide a sealed squeegee for discharging a solder paste with a uniform density, in which, as the pressurization device, the solder buffer accommodator, and the pressure buffer adjusting chamber, which accommodate a solder paste and are partitioned, are integrated into a pumping pad to form a single component, the pumping pad that expands by air pressure buffers a pressure shock occurring by a pressure applied to the pressurization chamber to minimize a pressure change within the pressurization chamber and continuously compensate for a pressure drop of the nozzle unit to always keep a pressure inside in front and rear directions constant and more stably discharge a solder paste with a uniform density, and thus adjusts the solder paste with a uniform density to always supply the solder past with the same density and improve printing quality by the uniform solder paste, minimize product defects, and minimize the amount of the remaining solder paste after the solder paste is supplied, thereby reducing waste of a raw material.

TECHNICAL SOLUTION

In order to achieve the above purpose, a sealed squeegee for supplying a solder paste with a uniform density, the sealed squeegee comprising: a chamber housing 100 that is formed long in a direction that intersects a direction in which a squeegee of a screen printer moves and is used to supply a solder paste to a mask with a uniform density. A solder mixer 200 including a pressurization chamber 210 that is formed to pass through the chamber housing 100 and has a "V" shaped cross section to uniformly mix the solder paste through pressure application and pressure buffering to left and right sides of the cross section, and a nozzle unit 220 that discharges the solder paste that is supplied and uniformly mixed into the pressurization chamber 210 to an outside and is formed to pass through a lower surface of the pressurization chamber 210, which are respectively formed on left and right sides of the cross section orthogonal to a longitudinal direction of the chamber housing 100; a squeegee blade holder 300 to which, a squeegee blade 310 coupled to front and rear sides of a lower side of the chamber housing 100 and provided to evenly spread the solder paste on the mask when the solder paste is supplied on the mask, is coupled; a holding and placing unit 400 in which the front and rear vertical surfaces 402 protrude above the chamber housing 100, and a placing horizontal surface 404, which includes at least one solder inlet 406, communicating with the pressurization chamber 210 and injects the solder past supplied from an outside into the pressurization chamber 210, is formed on an upper surface of the holding and placing unit 400, and which is formed a long way in left and right longitudinal directions; a pumping coupler 500 in which a pumping through hole 510 in communication with the pressurization chamber 210 is symmetrically formed on front and rear surfaces of the chamber housing 100 in a longitudinal direction, a sealed coupling groove 520 is formed on front and rear surfaces of each part of the chamber housing 100 on an outside of an inner periphery of the pumping through hole 510, and a hinge coupler 530 protrudes below the sealed coupling groove 520; a chamber sealing cover 600 in which the pumping coupler 500 is formed as a square plate with a length corresponding to left and right longitudinal directions of the chamber housing 100 to cover the pumping coupler 500 from the outside, a hinge coupling piece 610 hinged to the hinge coupler 530 is formed below the square plate to cover the pumping coupler 500 through pivoting movement, and a plurality of air injection holes 620 are formed on an outer surface to be symmetrical with each other in front and rear directions to supply and discharge compressed air toward the pumping through hole 510 of the pumping coupler 500; a pumping pad 700 that is airtightly coupled to the sealed coupling groove 520 while blocking the pumping through hole 510 formed in the pumping coupler 500 and is maintained to be airtightly coupled with the pumping coupler 500 while the chamber sealing cover 600 is pivoted toward the holding and placing unit 400, and repeatedly expands and contracts into the pressurization chamber 210 communicating with the pumping through hole 510 by compressed air supplied and discharged through a plurality of air injection holes to perform pumping to uniformly mix the solder paste accommodated in the pressurization chamber; a side cover 800 that is coupled to seal the pressurization chamber 210 that is open on left and right sides of the chamber housing 100 and in which an air vent 810 is formed to pass through the pressurization chamber 210 to discharge the air inside the pressurization chamber 210 of the chamber housing 100 and block inflow of external air; and a cover holding member 900 that is formed a long way in a left and right longitudinal direction and is coupled to the placing horizontal surface 404 to limit pivoting movement of the chamber sealing cover 600 that is pivoted toward the holding and placing unit 400 and in which a supply through hole 902 that communicates with the solder inlet 406 formed in the placing horizontal surface 404 and supplying the solder paste is provided.

In this regard, when compressed air is supplied through an air injection hole 620 of the chamber sealing cover 600 formed on a left side in a cross section, the pumping pad 700 coupled to a sealed coupling groove 520 while blocking a pumping through hole 510 expands into the pressurization chamber 210 on a left side in a "V" shaped cross section to pressurize and mix the solder paste accommodated inside the pressurization chamber, uniformly mixes the solder paste while being modified and buffered to an inner surface of the chamber sealed cover in the pumping through hole 510 through a pressure shock due to an expansion pressure of the pumping pad being passed through the pressurization chamber 210 on a right side in a "V" shaped cross section during a pressurization process, buffers a pressure shock within the pressurization chamber 210 on a right when a left side of the pressurization chamber 210 is pressurized, and buffers an pressure shock within the pressurization chamber 210 on the left when a right side is pressurized.

In one implementation, a closing surface 630 that is in contact with the vertical surface 402 of the holding and placing unit 400 and corresponds thereto is formed at a fore end to an opposite side to a side at which a hinge coupling piece 610 of the chamber sealing cover 600 is formed, a holding surface 640 defining the same surface as the placing horizontal surface 404 is formed to be perpendicular to the closing surface 630, the holding surface 640 defines the same horizontal surface as the placing horizontal surface 404 while the closing surface 630 is in contact with the vertical surface 402 and then the cover holding member 900 is coupled to the placing horizontal surface 404, and a lower surface of the cover holding member 900 is formed to control the pivoting movement for opening the chamber sealing cover 600 by pressing the holding surface 640.

In this regard, a front and rear width of the cover holding member 900 is formed to be smaller or greater than a width of the placing horizontal surface 404 and a holding surface 640, which form the same plane due to the pivoting movement of the chamber sealing cover 600 to the holding and placing unit 400, and is formed to be larger than a width of the placing horizontal surface 404.

In one implementation, the pumping pad 700 performs pumping while repeatedly expanding and contracting within the pressurization chamber 210 and the pumping through hole 510 by a pressure from compressed air supplied through the plurality of the air injection holes 620 formed in the chamber sealing cover 600 and is formed with a length corresponding to a length for sealing the pumping through hole 510, and includes a sealing unit 710 is airtightly coupled to the sealed coupling groove 520 formed around an inner periphery of the pumping through hole 510, and a pressurization buffer 720 that extends inside the sealing unit 710, is recessed into the pressurization chamber 210 from the pumping through hole 510, and expands toward the pressurization chamber 210 by compressed air supplied through the plurality of air injection holes 620 formed in the chamber sealing cover 600 or contracts and buffers a pressure shock inside the pressurization chamber 210 to uniformly mix the solder paste inside the pressurization chamber 210.

Further, a buffer expansion and contraction unit 722 recessed toward the pumping through hole in the pressurization chamber is further formed a long way at a center of the pressurization buffer to further expand into the pressurization chamber 210 and pressurize the solder paste via expansion of the pressurization buffer 720 and to buffer a pressure shock in the pressurization chamber based on pressurization through rapid contraction, and an entire cross section of the pressurization buffer and the buffer expansion and contraction unit is a "W" shape.

In one implementation, a sub pressurization buffer 724 is recessed toward the pressurization chamber 210 by a longitudinal-direction length of the pumping through hole 510 from a center of the buffer expansion and contraction unit 722 and is further formed in a buffer expansion and contraction unit to easily expand toward the pressurization chamber by compressed air to form an entire cross section as a wrinkled shape.

In one implementation, the pumping pad 700 is formed of any one of rubber or synthetic rubber, elastic synthetic resin, or silicon, which contracts and expands and has elasticity for restoration.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 is a diagram showing an example of a solder paste pump to which a conventional squeegee is coupled;

FIG. 2 is a diagram showing an example of a solder paste supply device to which a conventional squeegee is coupled;

FIG. 3 is a perspective view of an entire solder paste uniform density supply device to which a conventional squeegee is coupled;

FIG. 4 is a perspective view of an entire solder paste uniform density supply device to which a conventional squeegee is coupled and which has improved cleanability;

FIG. 5 is a perspective view of an entire sealed squeegee for supplying a solder paste with a uniform density, according to the present disclosure;

FIG. 6 is an exploded perspective view of a sealed squeegee for supplying a solder paste with a uniform density, according to the present disclosure;

FIG. 7 is a perspective view of a chamber housing of a sealed squeegee for supplying a solder paste with a uniform density, according to the present disclosure;

FIG. 8 is a side cross-sectional view showing an operating state of a sealed squeegee for supplying a solder paste with a uniform density, according to the present disclosure;

FIG. 9 is an enlarged diagram showing a main part in an operating state of the pumping pad of FIG. 8 of a sealed squeegee for supplying a solder paste with a uniform density, according to the present disclosure;

FIG. 10 is a side cross-sectional view showing an operating state of a sealed squeegee for supplying a solder paste with a uniform density, according to another embodiment of the present disclosure;

FIG. 11 is an enlarged diagram showing a main part in an operating state of the pumping pad of FIG. 10 of a sealed squeegee for supplying a solder paste with a uniform density, according to the present disclosure;

FIG. 12 is a side cross-sectional view showing an operating state of a sealed squeegee for supplying a solder paste with a uniform density, according to another embodiment of the present disclosure;

FIG. 13 is an enlarged diagram showing a main part in an operating state of the pumping pad of FIG. 12 of a sealed squeegee for supplying a solder paste with a uniform density, according to the present disclosure;

FIG. 14 is a partial exploded perspective view of a state before a pumping pad of a sealed squeegee for supplying a solder paste with a uniform density is coupled, according to the present disclosure.

FIG. 15 is a partial exploded perspective view of an operating state of a chamber sealed cover after a pumping pad of a sealed squeegee for supplying a solder paste with a uniform density is coupled, according to the present disclosure.

FIG. 16 is a partial exploded perspective view of a state after a pumping pad and a chamber sealed cover are coupled and before a cover holding member is coupled in a sealed squeegee for supplying a solder paste with a uniform density is coupled, according to the present disclosure; and FIG. 17 is a partial exploded perspective view of a state before a cover holding member of a sealed squeegee for supplying a solder paste with a uniform density is coupled, according to the present disclosure.

DETAILED DESCRIPTION OF THE INVENTION

Hereinafter, a solder pastes uniform density supply device according to an embodiment of the present disclosure will be described in detail with reference to the accompanying drawings.

As described above, a sealed squeegee for supplying a solder paste with a uniform density according to the present disclosure may uniformly mix a solder paste within a pressurization chamber by using a single component of a pumping pad without a separate component for pressurization and buffering compared with a conventional squeegee including the solder paste uniform density supply device, ensure ease of disassembly and assembly and ease of cleaning due to simplification of components, uniformly apply an even pressure when applying a pressure through expansion and contraction through an even inflow of compressed air while being inexpensive and more economical due to the characteristics of a pumping pad for pressurization and buffering, and simultaneously buffer a pressure shock without limiting to a specific part during buffering and effectively mix the solder paste with a uniform density, thereby effectively mixing the solder paste with a uniform density, and a shown in FIGS. 5 and 6, the sealed squeegee may include a chamber housing 100, a solder mixer 200, a squeegee blade holder 300, a holding and placing unit 400, a pumping coupler 500, a chamber sealing cover 600, a pumping pad 700, a side cover 800, and a cover holding member 900.

The chamber housing 100 is formed in such a way that, when the solder paste is supplied on a mask to a front of a position at which the squeegee and the chamber housing are parallel with each other, the squeegee is subsequently printed on the mask corresponding to a mask pattern, is formed a long way in a direction intersecting with a direction in which the squeegee of a screen printer, and is provided to supply the solder paste with a uniform density to the mask. That is, to uniformly mix the solder paste and to supply a uniform amount of the solder paste, the chamber housing 100 may be integrated with the solder mixer 200, the holding and placing unit 400, and the pumping coupler 500 to form one body, as described below with reference to FIGS. 5 to 7.

In the solder mixer 200, a solder paste is supplied and accommodated in a pressurization chamber formed to pass through the chamber housing 100 to the left and right and is uniformly mixed through a pumping operation by a pumping pad to be described below and compressed air, is discharged with a fixed amount onto a mask to prevent wastage of the solder paste and to enable high quality printing when printing on the mask, and the solder mixer 200 includes a pressurization chamber 210 for uniform mixing with the supplied solder paste, and a nozzle unit 220 configured to maintain the same pressure within the pressurization chamber and discharge a fixed amount without pressure loss.

That is, the solder mixer 200 may include the pressurization chamber 210 that is formed to pass through the chamber housing 100 and has a "V" shaped cross section to uniformly mix the solder paste through pressure application and pressure buffering to left and right sides of the cross section, and a nozzle unit 220 that discharges the solder paste that is supplied and uniformly mixed into the pressurization chamber 210 to the outside and is formed to pass through a lower surface of the pressurization chamber 210, which are respectively formed on the left and right sides of the cross section orthogonal to the longitudinal direction of the chamber housing 100 described above.

As shown in FIG. 8, in the pressurization chamber 210, when compressed air is supplied through an air injection hole 620 of the chamber sealing cover 600 formed on a left side in a cross section, described below, the pumping pad 700 coupled to a sealed coupling groove 520 while blocking a pumping through hole 510 expands into the pressurization chamber 210 on the left side in a "V" shaped cross section to pressurize and mix the solder paste accommodated inside the pressurization chamber, uniformly mixes the solder paste while being modified and buffered to an inner surface of the chamber sealed cover in the pumping through hole 510 through a pressure shock due to an expansion pressure of the pumping pad being passed through the pressurization chamber 210 on the right side in a "V" shaped cross section during the pressurization process, buffers a pressure shock within the pressurization chamber 210 on the right when the left side of the pressurization chamber 210 is pressurized, and buffers an pressure shock within the pressurization chamber 210 on the left when the right side is pressurized. That is, the pressurization chamber 210 is formed to simultaneously perform pressurization and buffering, and achieves uniform mixing at the center at which the nozzle unit is formed.

In more detail, conventionally, a pressurization device and a buffer device are separately configured, a pressurization device is coupled at any one side of the pressurization chamber, and a buffer device is configured at another side, and when the pressurization device is repeatedly pressured toward the solder paste inflowing into the pressurization chamber, a pressure in the pressurization chamber rises and a problem in that a pressure shock due to a pressure rise is overcome via buffering by the buffer device, and accordingly, while a constant pressure is maintained within the pressurization chamber, the solder paste is uniformly mixed and then discharged. That is, conventionally, as the pressurization device and the buffer device are configured separately and each operation is set differently, the structure is complex, and the pressing force is applied in one direction and buffering is also performed in one direction, and thus it takes a considerable time to uniformly mix the solder paste.

However, as in the present disclosure, as pressurization and buffering are repeated alternately in both directions, uniform mixing of the solder paste is achieved quickly, and the pressure in the pressurization chamber may always be maintained constant. The structure also includes a pressurization device and a buffer device that are formed as a single component by a pumping pad described below, which contracts and expands without a need to form a separate component, assembly and disassembly are easy, reducing assembly and disassembly time as well as cleaning time and operation stop time.

Therefore, the pressurization chamber 210, which has a "V" shaped cross section, is symmetrically configured to perform pressurization and buffering at both left and right sides, mixes the solder paste accommodated at the center with a uniform density through stirring and kneading through pressurization and buffering at both left and right sides, and discharges the uniformly mixed solder paste with a fixed amount through the nozzle unit 220 formed on a lower surface of the center.

In other words, a pressure shock occurs when the volume of the pressurization chamber on one side of a "V" shape changes rapidly due to a sudden pressure change caused by a pumping pad that expands and pressurizes with compressed air. Discharge of the solder paste due to repeated pressure increases or decrease also increases and decreases repeatedly and irregularly, and thus the pressure in the pressurization chamber needs to always be maintained the same.

Therefore, according to a pressing force of the pumping pad on one side, which is to be described below, the pumping pad on the other side is buffered by an amount corresponding to the pressing force, and the pressurization chamber always maintains the same pressure, and accordingly, the nozzle unit 220 may always maintain discharge at a constant rate as if rise cakes are discharged with the same thickness and density by pressurizing and clumping rice powders to extract the rice cake.

As shown in FIG. 6, the squeegee blade holder 300 is provided to print and push the solder paste, which is supplied to the mask and uniformly mixed, according to a printing pattern by downward pressure and forward moving force as the squeegee blade moves correspondingly, and includes a squeegee blade 310 coupled thereto, which is coupled to front and rear sides of a lower side of the chamber housing 100 and provided to evenly spread the solder paste on the mask is coupled to the squeegee blade holder 300 when the solder paste is supplied on the mask.

The squeegee blade 310 is formed a long way in left and right longitudinal directions front to back, and both sides are formed symmetrically, and thus a front squeegee blade spreads and presses the solder paste discharged onto the mask through the nozzle unit, and a rear squeegee blade collects the solder paste remaining on the mask, preventing excessive use of solder paste and enabling optimal use, thereby reducing the economic burden through appropriate use of expensive solder paste.

A certain amount of solder paste needs to be supplied to the squeegee blade through the nozzle unit 220 of the solder mixer 200 to enable printing without defects when printing according to the printing pattern. When the amount of solder paste is supplied excessively, the remaining solder paste remains and it is inconvenient to remove it, and when the amount of solder paste is small, it is impossible to print the printed pattern, resulting in printing defects. In other words, it is no exaggeration to say that the printing quality is determined by the constant discharge of solder paste that is uniformly mixed in the printing process using the squeegee blade.

The holding and placing unit 400 is formed with a solder injection port for supplying a solder paste into the pressurization chamber 210 of the chamber housing 100, and the chamber sealing cover 600, described below, is pivoted and is configured to plate and couple the cover holding member 900 to maintain and fix the pumping coupler 500, described later, in an airtight state of being closed, and as shown in FIGS. 6 and 7, the holding and placing unit 400 includes a vertical surface 402, a placing horizontal surface 404, and a solder inlet 406.

With regard to the vertical surface 402, front and rear vertical surfaces 402 may protrude to closely couple a front end of the chamber sealing cover 600, to be described below, which is pivoted to maintain airtightness in a state in which the chamber sealing cover 600 below is pivoted above the chamber housing 100 to close the pumping coupler 500. As shown in FIG. 15, the front and rear vertical surfaces 402 check a closed state of the pumping coupler 500 by pivoting the chamber sealing cover 600 to be described below, and check the chamber sealing cover 600 to be completely closed when a vertical surface of a closing surface formed at a fore end of the chamber sealing cover 600 match each other and the placing horizontal surface and the holding surface define the same plane, and when the vertical surface and the closing surface mismatch slightly, the placing horizontal surface and the holding surface do not form the same plane, and thus an error in closing of the chamber sealed cover occurs, airtight coupling of the pumping coupler 500 is not substantially maintained, and pressurization and buffering in the pressurization chamber are poor, resulting in poor uniform mixing of the solder paste.

As shown in FIG. 16, while the cover holding member 900 is placed and coupled to the placing horizontal surface 40, a supply through hole 902 of the cover holding member 900 and the solder inlet 406 formed in the placing horizontal surface 404 are coupled to each other to match each other, and the solder paste may be supplied and accommodated in the pressurization chamber 210 to pass through the solder inlet 406 through the supply through hole 902.

As shown in FIG. 17, a front and rear width of the cover holding member 900 is formed to be larger in a horizontal surface between the front and rear vertical surfaces 402 of the holding and placing unit 400, and thus the chamber sealing cover 600 to be described below is pivoted toward the holding and placing unit 400, and then after the holding surface formed at a fore end of the chamber sealing cover 600 forms the same plane as the placing horizontal surface 404, the cover holding member 900 is coupled to the placing horizontal surface 404, and the holding surface of the chamber sealed cover is fixed to a bottom surface coupled to the placing horizontal surface of the cover holding member 900 to control pivoting movement of the chamber sealed cover.

That is, the solder paste may be supplied to the pressurization chamber by the cover holding member 900 through the solder inlet 406 formed in the placing horizontal surface 404, and the pivoting movement of the chamber sealed cover may be simultaneously controlled and the chamber sealed cover is fixedly coupled to the cover holding member 900. A front and rear width of the cover holding member 900, which will be described below for controlling the chamber sealed cover, is smaller or greater than a width of the placing horizontal surface 404 and a holding surface 640, which form the same plane due to the pivoting movement of the chamber sealing cover 600 to the holding and placing unit 400, and only when the front and rear width of the cover holding member 900 is larger than the width of the placing horizontal surface 404, the pivoting movement of the chamber sealed cover may be controlled by the cover holding member 900.

As described above, the solder inlet 406 communicates with the pressurization chamber 210 on the placing horizontal surface 404, and at least one solder inlet 406 provided to allow a solder paste supplied from the outside to be injected into the pressurization chamber 210 is formed. That is, as shown in FIGS. 6 and 7, although one solder inlet 406 is shown to be formed at the center, at least one solder inlet 406 may be formed to simultaneously supply the same solder paste to the pressurization chamber 210 that is entirely formed a long way in a longitudinal direction.

The pumping through hole 510 in communication with the pressurization chamber 210 is symmetrically formed on front and rear surfaces of the chamber housing 100 in the longitudinal direction, the sealed coupling groove 520 is formed on front and rear surfaces of each part of the chamber housing 100 on an outside of an inner periphery of the pumping through hole 510, and the hinge coupler 530 protrudes below the sealed coupling groove 520 to supply compressed air to the pumping coupler 500 in a state in which airtightness of the pumping coupler 500 is maintained by pivoting movement of the chamber sealed cover and allow the pumping coupler 500 to expand and contract freely depending on supply and discharge the compressed air to perform pressurization and buffering and maintain pressure within the pressurization chamber. That is, as shown in FIG. 7, the pumping coupler 500 includes the pumping through hole 510, the sealed coupling groove 520, and the hinge coupler 530.

The pumping through hole 510 is formed a long way in a longitudinal direction to pass through the center of the pumping coupler 500 formed at one side to which the vertical surface 402 of the aforementioned holding and placing unit 400 and the squeegee blade holder 300 are coupled to each other. The pumping through hole 510 is symmetrical in front and rear directions based on the holding and placing unit 400, and the pumping through hole 510 communicating with the pressurization chamber is airtightly blocked by the pumping pad 700 to be described below.

The sealed coupling groove 520 is recessed on an outside of an inner periphery of the aforementioned pumping through hole 510 to couple a circumference of the pumping pad 700 to be described below thereto, and a central part of the pumping pad 700 may be airtightly sealed for expansion and contraction into the pressurization chamber by compressed air. As shown in FIGS. 8 and 9, in a process in which a contact area around an outer periphery of the pumping pad 700 increases and simultaneously the pumping pad expands and contracts, the pumping pad 700 is fitted into a shape corresponding to the recessed shape of the sealed coupling groove 520 in such a way that the outer circumference of the pumping pad is capable of withstanding a force pulled toward the pumping through hole.

The hinge coupler 530 is formed symmetrically in front and rear directions of the chamber housing 100 at an upper end to which the squeegee blade holder is coupled below the sealed coupling groove 520. The hinge coupler 530 is hinged to the hinge coupling piece 610 of the chamber sealed cover to be described below to allow the chamber sealing cover 600 to pivot, and as shown in FIGS. 5 to 8, as described above, the chamber sealing cover 600 is pivoted to the holding and placing unit 400 to pressurize the pumping pad 700 to be described below, and as a result, by pressurization of the chamber sealed cover, an outer circumference of the pumping pad 700 may not deviate from the sealing coupling groove 520 and the compressed air supplied to the center at which the sealing cover contracts and expands may not leak out during contraction and expansion of the pumping pad, thereby smoothly performing pumping.

As described above, the chamber sealing cover 600 may cover the pumping coupler between the vertical surface 402 of the holding and placing unit from the outside to maintain airtightness in a process of supplying and discharging of compressed air for contraction and expansion of the pumping pad 700 coupled to the pumping through hole 510 of the pumping coupler 500 and may also be pivoted toward the holding and placing unit from the hinge coupler 530 to apply a pressurization force to maintain coupling of the pumping pad, and as shown in FIGS. 14 to 17, the pumping coupler 500 is formed as a square plate with a length corresponding to left and right longitudinal directions of the chamber housing 100 to cover the pumping coupler 500 from the outside, the hinge coupling piece 610 hinged to the hinge coupler 530 is formed below the square plate to cover the pumping coupler 500 through pivoting movement, and the plurality of air injection holes 620 may be formed on an outer surface to be symmetrical with each other in front and rear directions to supply and discharge compressed air toward the pumping through hole 510 of the pumping coupler 500. That is, as shown in FIGS. 5 and 6, the chamber sealing cover 600 includes the hinge coupling piece 610 and the air injection hole 620.

As described above, the hinge coupling piece 610 is hinged to the hinge coupler 530 of the pumping coupler 500 to allow the chamber sealing cover 600 formed in a square plate to pivot toward the holding and placing unit 400. By configuring the chamber sealing cover 600, it is easy to replace the pumping pad 700 which is described below and coupled to the sealed coupling groove 520 formed around an outer periphery of the pumping through hole 510 of the pumping coupler 500, preventing damage or breakage of the pumping pad, and when a service life is over, the pumping pad 700 may be easily replaced by opening the chamber sealed cover, thereby minimizing downtime.

The air injection hole 620 maintains airtightness by pressurizing the outer periphery of the pumping pad 700 by an inner surface of the chamber sealing cover 600, which is in contact with the pumping coupler 500, and the pumping pad 700 is coupled to the air injection hole 620 to supply or discharge compressed air to an expansion and contraction portion of the pumping pad fitted into the pressurization chamber through the pumping through hole to allow the pumping pad 700 to expand and contact into the pressurization chamber 210 in a state in which the pumping through hole 510 is closed.

That is, as shown in FIGS. 8 to 13, when compressed air is supplied through the air injection hole 620, a volume change occurs within the pressurization chamber 210 as a portion of the pumping pad, which is fitted into the pressurization chamber, expands, and as air in the pressurization chamber 210 pressurizes the accommodated solder paste by the volume change, according to this volume change, while the solder paste moves to an opposite side of the pressurization chamber with a "V" shaped cross-section, the air in the pressurization chamber on the opposite side pushes the pumping pad 700 at the opposite side, and when compressed air is supplied again to the pumping pad 700 at the opposite side, the pressure moves according to the volume change within the pressurization chamber in the reverse order described above, and the solder paste is uniformly mixed and pressurized.

Therefore, the pumping pad 700 expands and contracts by compressed air supplied and discharged through the air injection hole 620, and correspondingly, the solder paste in the pressurization chamber 210 is stirred and mixed while moving in a direction in which a pressure change occurs according to a changed volume, thereby uniformly mixing the solder paste. Because a pressure is constant according to the volume change, the pumping pad is repeatedly pressured and contracted in a state in which the pressure inside the pressurization chamber 210 is maintained the same, and it is easy to uniformly mix the solder paste and easily discharge a fixed amount of solder paste. That is, to prevent an excessive pressure change, supply and discharge of compressed air is adjusted, and thus a change in expansion and contraction of the pumping pad is also performed always in the same way, the same pressure within the pressurization chamber is maintained along with the same volume change, thereby always maintaining discharge of the solder paste through the nozzle unit in the same way.

In the chamber sealing cover 600 shown in FIGS. 2 to 14, a closing surface 630 that is in contact with the vertical surface 402 of the holding and placing unit 400 and corresponds thereto is formed at a fore end to an opposite side to a side at which a hinge coupling piece 610 is formed, the holding surface 640 defining the same surface as the placing horizontal surface 404 is formed to be perpendicular to the closing surface 630, and the holding surface 640 defines the same horizontal surface as the placing horizontal surface 404 while the closing surface 630 is in contact with the vertical surface 402 and then the cover holding member 900 is coupled to the placing horizontal surface 404, and accordingly, a lower surface of the cover holding member 900 is formed to control the pivoting movement for opening the chamber sealing cover 600 by pressing the holding surface 640.

As described above, the pumping pad 700 is configured to perform buffering according to a pressure change and a pressure change applied to the solder paste by changing the volume within the pressurization chamber 210 and configured to enable uniform mixing and constant discharge of solder paste while minimizing or limiting a pressure shock due to pressure changes in the pressurization chamber as if a balloon is repeatedly blown to the same and repeatedly returns to an original state. As shown in FIGS. 8 to 13, the pumping pad 700 is airtightly coupled to the sealed coupling groove 520 while blocking the pumping through hole 510 formed in the pumping coupler 500 and is maintained to be airtightly coupled with the pumping coupler 500 while the chamber sealing cover 600 is pivoted toward the holding and placing unit 400, and the pumping pad 700 repeatedly expands and contracts into the pressurization chamber 210 communicating with the pumping through hole 510 by compressed air supplied and discharged through a plurality of air injection holes to perform pumping to uniformly mix the solder paste accommodated in the pressurization chamber.

As described above, the pumping pad 700 may perform pumping while repeatedly expanding and contracting within the pressurization chamber 210 and the pumping through hole 510 by a pressure from compressed air supplied through the plurality of the air injection holes 620 formed in the chamber sealing cover 600 and may be formed with a length corresponding to a length for sealing the pumping through hole 510, and as shown in FIG. 9, the pumping pad 700 may include a sealing unit 710 and a pressurization buffer 720.

As described above, the sealing unit 710 is formed in a shape corresponding to the sealed coupling groove 520 and is formed to be fitted thereinto, and is airtightly coupled to the sealed coupling groove 520 formed around an inner periphery of the pumping through hole 510 to prevent separation from the sealed coupling groove due to elastic deformation and elastic restoration force generated by contraction and expansion of the pressurization buffer 720 to be described below and to ensure a more ensured airtight coupling by expanding a contact area for airtight coupling.

As described above, the pressurization buffer 720 causes a change in the volume of the pressurization chamber 210 through contraction and expansion when inserted into the pressurization chamber 210, thereby generating pressure change and pressing force to uniformly mix the solder paste, extends inside the sealing unit 710, is recessed into the pressurization chamber 210 from the pumping through hole 510, and expands toward the pressurization chamber 210 by compressed air supplied through the plurality of air injection holes 620 formed in the chamber sealing cover 600 or contracts and buffers a pressure shock inside the pressurization chamber 210 to uniformly mix the solder paste inside the pressurization chamber 210.

The pressurization buffer 720 may be easily elastically deformed depending on the amount of compressed air supplied through the air injection hole, and is made of any one of rubber or synthetic rubber, elastic synthetic resin, or silicon, which has elasticity that quickly restores elasticity, and in addition to the composition of the above materials, materials for easily achieving elastic recovery and elastic deformation by supply and discharge of compressed air may belong to a pumping pad according to the present disclosure.

As shown in FIGS. 5 and 6, the side cover 800 is coupled to seal the pressurization chamber 210 that is open on left and right sides of the chamber housing 100, and an air vent 810 is formed to pass through the pressurization chamber 210 to discharge the air inside the pressurization chamber 210 of the chamber housing 100 and block inflow of external air. In other words, the side cover 800 is formed to discharge the air within the pressurization chamber 210 to the outside and prevent inflow of the outside air into the inside, and the air vent of the side cover 800 blocks inflow of external air and discharge internal air to the outside when a pressure of internal air inside the pressurization chamber is applied due to a volume change of the pressurization chamber along with expansion of the aforementioned pumping pad.

As shown in FIGS. 5 and 6, the cover holding member 900 supplies a solder paste to the solder inlet 406 to prevent the chamber sealing cover 600 that is pivoted and folded from being pivoted and spread again, is formed a long way in a left and right longitudinal direction, and as shown in FIG. 17, and is coupled to the placing horizontal surface 404 to limit pivoting movement of the chamber sealing cover 600 that is pivoted toward the holding and placing unit 400, and the supply through hole 902 that communicates with the solder inlet 406 formed in the placing horizontal surface 404 and supplying a solder paste is provided.

That is, as shown in FIGS. 16 and 17, coupling of the cover holding member 900 needs to be released to release a portion in which pivoting movement of the chamber sealing cover 600 is controlled to open the chamber sealing cover 600 through pivoting movement from the pumping coupler 500, and accordingly, it is possible to replace the pumping pad 700 or clean the inside of the pressurization chamber. In other words, the cover holding member 900 serves as a key to control pivoting of the chamber sealed cover, and ultimately serves as a key for cleaning for removing the remaining solder paste of the chamber housing 100 and the pressurization chamber 210.

With regard to assembly of the sealed squeegee for supplying a solder paste with a uniform density according to the present disclosure with the above configuration, as shown in FIG. 14, the chamber housing 100 in which the pressurization chamber 210 is formed to extend left and right through the center of the chamber housing 100, and the solder mixer 200 including a nozzle unit through which a solder paste is to be discharged, is integrally formed inside the pressurization chamber 210 is prepared, and the squeegee blade 310 is coupled by the squeegee blade holder 300 at front and rear lower parts centered on the nozzle unit 220 of the chamber housing 100.

Then, the hinge coupling piece 610 of the chamber sealing cover 600 is hinged to a hinge coupler 530 provided in the pumping coupler 500 of the chamber housing 100, and thus the chamber sealing cover 600 is coupled to the hinge coupler 530 to enable pivoting movement toward the holding and placing unit 400 formed above the chamber housing 100.

Then, as shown in FIGS. 14 and 15, after the side cover 800 is coupled to the left and right ends of the chamber housing 100 to ensure that the left and right sides of the pressurization chamber 210 are airtight, the sealing unit 710 of the pumping pad 700 corresponds to the sealed coupling groove 520 formed around the pumping through hole 510 of the pumping coupler 500 and is fitted thereinto to be airtight, and according to coupling of the pumping pad 700, the pressurization buffer 720 of the pumping pad 700 is coupled to contract and expand into the pressurization chamber 210 through the pumping through hole 510.

Then, as shown in FIGS. 15 and 16, the chamber sealing cover 600 pivots, and while the chamber sealing cover 600 pivots toward the holding and placing unit 400, the closing surface 630 corresponding to the vertical surface 402 from a perpendicularly chamfered part of the fore end of the chamber sealed cover is in contact with the vertical surface 402 of the holding and placing unit 400 to be in contact therewith, and simultaneously, the holding surface 640 formed perpendicularly to the closing surface 630 of the chamber sealed cover is coupled thereto to form the same surface as the placing horizontal surface 404 of the holding and placing unit 400.

Then, as shown in FIG. 17, while the cover holding member 900 is placed and coupled to the placing horizontal surface 404 of the holding and placing unit, the solder inlet 406 formed on the placing horizontal surface 404 and the supply through hole 902 of the cover holding member 900 are coupled to each other to communicate with each other. Therewith, as a bottom surface of a fore end of front and rear sides of the cover holding member 900 is pressed and coupled with the holding surface 640 formed at the fore end of the chamber sealing cover 600, and thus while the chamber sealing cover 600 maintains in a state in which the chamber sealing cover 600 pivots toward the holding and placing unit 400, thereby controlling pivoting movement and performing locking.

Then, while compressed air is supplied through the air injection hole 620 of the chamber sealing cover 600 and a side of left and right sides of a "V" shaped cross section of the pressurization chamber 210, which expands first by compressed air, changes in a volume, the pressurization buffer 720 of the pumping pad 700 discharges internal air inside the pressurization chamber 210 through the air vent 810 of the side cover 800 and pressurizes the accommodated solder paste.

Then, the pressurized solder paste moves a pressurized opposite side with a "V" shape by a pressure from pressurization while being stirred and mixed at a center side in which the nozzle unit 220 is formed at the bottom, causing a pressure shock. In this case, when the pressure shock is not buffered, a pressure change of the solder paste being stirred and mixed at a side of the nozzle unit 220 may not be constant, and a problem in which the pressure increases or decreases occurs, but the pressurization buffer 720 of the pumping pad 700 at the opposite side receives the pressure shock according to the volume change and contracts or elastically deforms toward the chamber sealing cover 600 to compensate for the change in volume.

Accordingly, as shown in FIGS. 8 and 9, pressurization and buffering are performed by the pressurization buffer 720 of the pumping pad 700 while the pressure change due to pressure shock does not decrease or increase and maintains a constant pressure, an opposite side to the aforementioned portion is operated to allow left and right sides of the pumping pad 700 to alternately perform pressurization and buffering to uniformly mix the solder paste within the pressurization chamber 210 when the pressure shock is buffered to supply compressed air to the pressurization buffer 720 at the opposite side, which is contracted and elastically deformed, and a pressure within the pressurization chamber 210 may also be maintained at the same pressure according to volume changes, thereby discharging a certain amount of solder paste through the nozzle unit.

Through pumping of the pumping pad 700 as described above, uniform mixing of the solder paste within the pressurization chamber 210 and maintenance of a constant pressure may be easily achieved, thereby improving mask printing quality through uniform supply of the solder paste. When the pumping pad responsible for direct pumping in the sealed squeegee capable of supplying solder paste uniform density according to the present disclosure is damaged or needs to be replaced due to expiration of service life, the chamber housing 100 may be easily disconnected from the cover holding member 900, and then the pumping pad 700 may be removed quickly and easily with only the opening pivoting movement of the chamber sealing cover 600, and may be easily replaced without special skills, minimizing downtime and reducing a production time and overall tact time.

To replace the current solder paste with a different type of solder paste, the chamber housing 100 may be decoupled from the cover holding member 900 and may be easily and quickly disassembled in the reverse order of the assembly process described above, enabling quick cleaning and preventing defects due to mixing of different solder pastes due to the remaining solder paste.

The pumping pad 700 described above has a shape corresponding to a half of a square in cross section, which is a part that contracts and expands into the pressurization chamber, which will be explained in more detail through another example.

<Embodiment 1> A cross section of the pumping pad 700 is formed in a shape of "W". To form the above shape, in the basic configuration of the pumping pad 700 according to the present disclosure including the sealing unit and the pressurization buffer 720, a buffer expansion and contraction unit 722 recessed toward the pumping through hole in the pressurization chamber is formed a long way at the center of the pressurization buffer to further expand into the pressurization chamber 210 and pressurize the solder paste via expansion by compressed air supplied to the pressurization buffer 720 through the solder inlet 406 and to buffer a pressure shock in the pressurization chamber based on pressurization through rapid contraction. As shown in FIGS. 8 and 9, as the buffer expansion and contraction unit 722 with a shape of "∩" recessed upward from the center of a cross section of a "U" shape of the pressurization buffer 720 as a basic configuration, the entire cross section may have a shape of "W" as shown in FIGS. 10 and 11.

As the "W" shaped cross section as described above is formed, the pressurization buffer 720 is arranged on left and right sides based on the buffer expansion and contraction unit 722, and when compressed air is supplied through the solder inlet 406, as the portions of the pressurization buffer 720, which are disposed on the left and right sides, begins to expand and continues to expand, the buffer expansion and contraction unit 722 formed in the center expands while elastically deforming into the pressurization chamber 210, causing a volume change in the pressurization chamber 210, and as air inside the pressurization chamber is discharged to the outside through the air vent 810, the pressure due to a change in volume pressurizes the solder paste contained in the pressurization chamber.

Then, the buffer expansion and contraction unit 722 of the pumping pad, which is symmetrically formed on the opposite side, is recessed toward the pumping through hole 510, and thus a pressure change due to a volume change and the resulting pressure shock are primarily buffered by the recessed space by the buffer expansion and contraction unit 722, and a pressure shock generated due to a pressure exceeding the previous pressure may be more rapidly buffered because the buffer expansion and contraction unit 722 continues to expand toward the pumping through hole 510 and the portions of the pressurization buffer 720, which are formed on the left and right, are elastically deformed.

Therefore, the configuration of the buffer expansion and contraction unit 722 further changes the volume change in the pressurization chamber, further increasing the pressure applied to the solder paste contained in the pressurization chamber, and also more rapidly buffers the pressure shock in the pressurization chamber through the space recessed into the pumping through hole, and thus only the pressurization buffer 720, which is formed as a basic configuration, is sufficient to uniformly mix the solder paste and maintain a constant pressure in the pressurization chamber. However, the present embodiment may be applied when pressure or buffering may vary depending on the different types of solder paste and the solder paste needs to be evenly mixed, and may also be applied to a general case in which the basic configuration having the pressurization buffer 720 formed alone.

<Embodiment 2> A cross section of the pumping pad 700 is formed in a wrinkled shape. To form the above shape, in the basic configuration of the pumping pad 700 according to the present disclosure including the sealing unit and the pressurization buffer 720, the buffer expansion and contraction unit 722 is formed, a sub pressurization buffer 724 is recessed toward the pressurization chamber 210 by a longitudinal-direction length of the pumping through hole 510 from the center of the buffer expansion and contraction unit 722 and is further formed in the buffer expansion and contraction unit to easily expand toward the pressurization chamber by compressed air. As shown in FIGS. 8 and 9, in a state in which, as the buffer expansion and contraction unit 722 with a shape of "∩" recessed upward from the center of a cross section of a "U" shape of the pressurization buffer 720 as a basic configuration, the entire cross section has a shape of "W" as shown in FIGS. 10 and 11, the "U" shaped sub pressurization buffer 724 is formed again in the center of the "∩" shaped buffer expansion and contraction unit 722, and thus the overall cross sectional shape is formed as a wrinkled cross section, as shown in FIGS. 12 and 13. As the wrinkled shaped cross section as described above is formed, the pressurization buffer 720 and the buffer expansion and contraction unit 722 are arranged on left and right sides based on the buffer expansion and contraction unit 722, and when compressed air is supplied through the solder inlet 406, as the sub pressurization buffer 724 recessed into the pressurization chamber in the center begins to expand first, the pressurization buffer 720, which is located on the left and right sides, also expands inside the pressurization chamber. Then, as the sub pressurization buffer 724 and the pressurization buffer 720 continue to expand, the buffer expansion and contraction unit 722 formed between the sub pressurization buffer 724 and the pressurization buffer 720 expands while elastically deforming into the pressurization chamber 210, causing a change in the volume of the pressurization chamber 210, air inside the pressurization chamber according to the volume change is discharged to the outside through the air vent 810, and a pressure due to the change in volume pressurizes the solder paste contained in the pressurization chamber. Then, the buffer expansion and contraction unit 722 of the pumping pad, which is symmetrically formed on the opposite side, is recessed toward the pumping through hole 510, and thus a pressure change due to a volume change and the resulting pressure shock are primarily buffered by the recessed space by the buffer expansion and contraction unit 722, a pressure shock generated due to a pressure exceeding the previous pressure is secondarily buffered while the sub pressurization buffer 724 elastically deforms and expands toward the pumping through hole 510, and the portions of the pressurization buffer 720, which are formed at both left and right ends, also expands after elastic deformation toward the pumping through hole 510 through tertiary buffering to ensure that pressure buffering occurs most quickly and precisely.

Therefore, the configuration of the sub pressurization buffer 724 allows an inner part of the sealing unit of the pumping pad to take a wrinkled form, minimizing resistance to compressed air and simultaneously allowing rapid expansion, thereby quickly changing the volume within the pressurization chamber, and the pressure applied to the solder paste contained in the pressurization chamber may be rapidly increased and a pressure shock may be buffered most quickly and accurately.

Accordingly, uniform density mixing of the solder paste and maintaining of a pressure while minimizing a pressure change within the pressurization chamber are achieved through pumping by the pumping pad 700, which simultaneously performs pressurization and buffering without a need for a separate pressurization device or buffer device with a complicated configuration, and thus it is possible to more easily discharge a fixed amount of solder paste discharged through the mask. As mentioned above, only the pumping pad 700 is easy to be replaced, and disassembly and assembly for easy cleaning is simple and quick, which also improves cleanability for replacing different types of solder paste.

According to the present disclosure, among the components of the conventional solder paste uniform density supply device according to the present disclosure, a pressure buffer adjusting chamber and a pressurization device and a buffer adjuster that are correspondingly coupled thereto may be integrated with the pumping pad to form a single component, thereby reducing the number of components, improving a sealing force, and simplifying even pressurization and buffering of the pressure, the solder paste for printing may be discharged with a uniform density by quickly discharging internal air to the outside from left and right sides of the pressurization chamber and mixing the solder paste with a uniform density within the pressurization chamber and filled without voids, in the pressurization chamber in which a solder paste is mixed with a uniform density, the solder paste may be mixed at a uniform pressure, while the pressure buffer adjusting chamber, the pressurization device, and the buffer adjuster are integrated into the pumping pad configuration, thereby simplifying and disassembling components, improving ease of assembly and cleanability, and allowing cleaning without residue of solder paste once used, and through this, when using a different type of solder paste, a defect rate is minimized because there is no heterogeneous mixing between the remaining solder paste and the newly introduced solder paste, and the sealing force is improved and a large amount of solder along the longitudinal direction of the pressurization chamber is simultaneously discharged through a single pumping process, thereby effectively and quickly forming uniform density of solder paste through pressurization and achieving a short stirring time.

According to the present disclosure, as the pressurization device, the solder buffer accommodator, and the pressure buffer adjusting chamber, which accommodate a solder paste and are partitioned, are integrated into a pumping pad to form a single component, the pumping pad that expands by air pressure may buffer a pressure shock occurring by a pressure applied to the pressurization chamber to minimize a pressure change within the pressurization chamber and continuously compensate for a pressure drop of the nozzle unit to always keep a pressure inside in front and rear directions constant and more stably discharge a solder paste with a uniform density, and thus may adjust the solder paste with a uniform density to always supply the solder past with the same density and improve printing quality by the uniform solder paste, minimize product defects, and minimize the amount of the remaining solder paste after the solder paste is supplied, thereby reducing waste of a raw material.

What is claimed is:

1. A sealed squeegee for supplying a solder paste with a uniform density, the sealed squeegee comprising:

a chamber housing (100) having a first end and a second end, wherein a direction extending between the first end and the second end is defined as a longitudinal direction of the chamber housing (100), and the chamber housing (100) is used to supply the solder paste to a mask with the uniform density, a solder mixer (200) including:

a pressurization chamber (210) that is formed to pass through the chamber housing (100) and has a "V" shaped cross section to uniformly mix the solder paste through pressure application and pressure buffering to left and right sides of the "V" shaped cross section orthogonal to the longitudinal direction of the chamber housing (100), and a nozzle unit (220) that externally discharges the solder paste that is supplied and uniformly mixed in the pressurization chamber (210) and is formed to pass through a lower surface of the pressurization chamber (210);

a squeegee blade holder (300) to which a squeegee blade (310) is coupled, the squeegee blade (310) being coupled to a lower side of the chamber housing (100) and configured to evenly spread the solder paste on the mask when the solder paste is supplied on the mask;

a holding and placing unit (400) in which vertical surfaces (402) protrude above the pressurization chamber (210), and a placing horizontal surface (404), which includes at least one solder inlet (406), communicating with the pressurization chamber (210) and for injecting the solder paste into the pressurization chamber (210), is an upper surface of the holding and placing unit (400), and is formed in the longitudinal direction of the chamber housing (100);

a pumping coupler (500) to which a pumping through hole (510) in communication with the pressurization chamber (210) is formed on the chamber housing (100), a sealed coupling groove (520) is formed on an outside of an inner periphery of the pumping through hole (510), and a hinge coupler (530) protrudes next to the sealed coupling groove (520);

a chamber sealing cover (600) in which the chamber sealing cover (600) is formed as a plate in the longitudinal direction of the chamber housing (100) to externally cover the pumping coupler (500), a hinge coupling piece (610) hinged to the hinge coupler (530) is formed on the plate to cover the pumping coupler (500) through pivoting movement, and a plurality of air injection holes (620) are formed on an outer surface of the plate to supply and discharge compressed air toward the pumping through hole (510) of the pumping coupler (500);

a pumping pad (700) that is airtightly coupled in the sealed coupling groove (520) while blocking the pumping through hole (510) formed in the pumping coupler (500), is maintained to be airtightly coupled with the pumping coupler (500) while the chamber sealing cover (600) is pivoted toward the holding and placing unit (400), and repeatedly expands and contracts into the pressurization chamber (210) communicating with the pumping through hole (510) by the compressed air supplied and discharged through the plurality of air injection holes (620) to perform pumping to uniformly mix the solder paste supplied in the pressurization chamber (210);

a side cover (800) that is coupled to one of the first and second ends to seal the pressurization chamber (210), and in which an air vent (810) is formed in the side cover (800) to discharge air inside the pressurization chamber (210) of the chamber housing (100) and block inflow of external air; and a cover holding member (900) that is formed in the longitudinal direction and is coupled to the placing horizontal surface (404) to limit the pivoting movement of the chamber sealing cover (600), which pivots toward the holding and placing unit (400), and in which a supply through hole (902) that communicates with the solder inlet (406) and that supplies the solder paste is provided;

wherein a first set includes one of each of the squeegee blade holder, the pumping coupler, the chamber sealing cover, and the pumping pad, on the left side and a second set includes another of each of the squeegee blade holder, the pumping coupler, the chamber sealing cover, and the pumping pad on the right side.

2. The sealed squeegee according to claim 1, wherein a closing surface (630), which is in contact with the vertical surface (402) of the holding and placing unit (400) and corresponds thereto, is formed at a side opposite to a side at which the hinge coupling piece (610) of the chamber sealing cover (600) is formed, a holding surface (640), which is coplanar with the placing horizontal surface (404), is formed to be perpendicular to the closing surface (630), so while the closing surface (630) is in contact with the vertical surface (402) a lower surface of the cover holding member (900) is coupled to and pressing the placing horizontal surface (404) and the holding surface (640) to control the pivoting movement for opening the chamber sealing cover (600).

3. The sealed squeegee according to claim 2, wherein a width of the cover holding member (900) is formed to be greater than a combined width of the placing horizontal surface (404) and the holding surface (640).

4. The sealed squeegee according to claim 1, wherein the pumping pad (700) is formed with a length corresponding to a length for sealing the pumping through hole (510), and includes a sealing unit (710) and a pressurization buffer (720) that extends inside the sealing unit (710).

5. The sealed squeegee according to claim 4, wherein a buffer expansion and contraction unit (722) recessed toward the pumping through hole (510) is further formed at a center of the pressurization buffer (720) to further expand into the pressurization chamber (210) to pressurize the solder paste via expansion of the pressurization buffer (720) and to buffer a pressure shock in the pressurization chamber (210) based on pressurization through rapid contraction, and an entire cross section of the pressurization buffer (720) and the buffer expansion and contraction unit (722) is a "W" shape.

6. The sealed squeegee according to claim 5, wherein a sub pressurization buffer (724) is recessed toward the pressurization chamber (210) from the center of the buffer expansion and contraction unit (722) and is further formed in the buffer expansion and contraction unit (722) to expand toward the pressurization chamber (210) to form the entire cross section as a wrinkled shape.

7. The sealed squeegee according to claim 1, wherein the pumping pad (700) is formed of any one of rubber, synthetic rubber, elastic synthetic resin, or silicon, which contracts and expands and has elasticity for restoration.

* * * * *